(12) United States Patent
Agrawal et al.

(10) Patent No.: US 11,809,837 B2
(45) Date of Patent: Nov. 7, 2023

(54) INTEGER MATRIX MULTIPLICATION BASED ON MIXED SIGNAL CIRCUITS

(71) Applicant: International Business Machines Corporation, Armonk, NY (US)

(72) Inventors: Ankur Agrawal, Chappaqua, NY (US); Martin Cochet, South Salem, NY (US); Jonathan E. Proesel, Mount Vernon, NY (US); Sergey Rylov, White Plains, NY (US); Bodhisatwa Sadhu, Peekskill, NY (US); Hyunkyu Ouh, Corvallis, OR (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 17/012,916

(22) Filed: Sep. 4, 2020

(65) Prior Publication Data

US 2022/0075596 A1   Mar. 10, 2022

(51) Int. Cl.
*G06F 7/544* (2006.01)
*G06F 7/523* (2006.01)
(Continued)

(52) U.S. Cl.
CPC .............. *G06F 7/5443* (2013.01); *G06F 7/50* (2013.01); *G06F 7/523* (2013.01); *H03K 19/20* (2013.01); *H03M 1/466* (2013.01); *H03M 1/68* (2013.01)

(58) Field of Classification Search
CPC .......... G06F 7/50; G06F 7/523; G06F 7/4876; G06F 7/4985; G06F 7/4983;
(Continued)

(56) References Cited

U.S. PATENT DOCUMENTS 9,069,995 B1   3/2015 Nestler et al.
10,452,745 B2  10/2019 Fick et al.
(Continued)

OTHER PUBLICATIONS

K. Sanni et al., A Historical Perspective on Hardware AI Inference, Charge-Based Computational Circuits and an 8 bit Charge-Based Multiply-Add Core in 16 nm FinFET CMOS, IEEE Journal on Emerging and Selected Topics in Circuits and systems, vol. 9, No. 3, 2019 (Year: 2019).*

(Continued)

*Primary Examiner* — Emily E Larocque
(74) *Attorney, Agent, or Firm* — Daniel Morris; Otterstedt & Kammer PLLC

(57) ABSTRACT

A multiply-accumulate device comprises a digital multiplication circuit and a mixed signal adder. The digital multiplication circuit is configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands. The mixed signal adder comprises one or more stages, at least one stage configured to input the N one-bit multiplication outputs, each stage comprising one or more inner product summation circuits; and a digital reduction stage coupled to an output of a last stage of the one or more stages and configured to generate an output of the multiply-accumulate device based on the L $m_1$-bit multipliers and the L $m_2$-bit multiplicands.

9 Claims, 16 Drawing Sheets

(51) Int. Cl.
H03K 19/20 (2006.01)
H03M 1/68 (2006.01)
H03M 1/46 (2006.01)
G06F 7/50 (2006.01)

(58) Field of Classification Search
CPC ....... G06F 7/5443; H03M 1/68; H03M 1/466; G06G 7/184; H03K 19/20
See application file for complete search history.

(56) References Cited

U.S. PATENT DOCUMENTS

| | | | |
|---|---|---|---|
| 2019/0080231 | A1 | 3/2019 | Nestler et al. |
| 2020/0127626 | A1* | 4/2020 | Paulsen ................ H03M 1/206 |
| 2022/0206754 | A1* | 6/2022 | Kraemer ............... G06F 7/5443 |

OTHER PUBLICATIONS

Ghodrati et al., Mixed-Signal Charge-Domain Acceleration of Deep Neural networks through Interleaved Bit-Partitioned Arithmetic, arXiv preprint arXiv:1906.11915, 2019, 15 pages.

Zhang et al., An Energy-Efficient Mixed-Signal Parallel Multiply-Accumulate (MAC) Engine Based on Stochastic Computing. arXiv preprint arXiv:1907.01807, 2019, 7 pages.

Huang, Y. Hybrid Analog-Digital Co-Processing for Scientific Computation (Doctoral dissertation, Columbia University), 2018, 175 pages.

Yamaguchi et al., An Energy-efficient Time-domain Analog VLSI Neural Network Processor Based on a Pulse-width Modulation Approach. arXiv preprint arXiv:1902.07707, 2019, 13 pages.

Rekhi et al., Analog/Mixed-Signal Hardware Error Modeling for Deep Learning Inference. In Proceedings of the 56th Annual Design Automation Conference 2019 pp. 81-86, ACM.

Jia et al., A Microprocessor implemented in 65nm CMOS with Configurable and Bit-scalable Accelerator for Programmable In-memory Computing, arXiv preprint arXiv:1811.04047 (2018).

Zhang et al., A Matrix-Multiplying ADC Implementing a Machine-Learning Classifier Directly with Data Conversion, 2015 IEEE International Solid-State Circuits Conference, pp. 332-334.

Lee et al., A 2.GHz 7.7TOPS/W Switched-Capacitor Matrix Multiplier with Co-designed Local Memory in 40nm, 2016 IEEE International Solid-State Circuits Conference, pp. 418-420.

Bankman et al., An 8-bit, 16 input, 3.2 pJ/op Switched-Capacitor Dot Product Circuit in 28-nm FDSOI CMOS, IEEE Asian Solid-State Circuits Conference, 2016, pp. 21-24.

Bankman et al., An Always-On 3.8 µJ/86% CIFAR-10 Mixed-Signal Binary CNN Processor with All Memory on Chip in 28nm CMOS, 2018 IEEE International Solid-State Circuits Conference, pp. 222-224.

Wallace, A suggestion for a fast multiplier, IEEE Transactions on electronic Computers (1), Feb. 1964, pp. 14-17.

Sarpeshkar, Analog versus digital: extrapolating from electronics to neurobiology, Neural computation, 10(7), pp. 1601-1638, Oct. 1998 https://www.rle.mit.edu/acbs/pdfpublications/journal_papers/analog_vs_digital.pdf.

Hosticka, Performance comparison of analog and digital circuits, Proceedings of the IEEE, Jan. 1985, 73(1), pp. 25-29.

White et al., Low-Power Analog Processing for Sensing Applications: Low-Frequency Harmonic Signal Classification, Sensors (Basel, Switzerland), 13. pp. 9604-9623. 10.3390/s130809604, Aug. 2013.

Hasler, Starting Framework for Analog Numerical Analysis for Energy-Efficient Computing, Journal of Low Power Electronics and Applications, 7. 17. 10.3390/jlpea7030017, 22 pages, Sep. 2017.

* cited by examiner $$R_{out} = \sum_{0}^{255} x_i * w_i \implies R_{out} = \sum_{\substack{m,n \\ 16}} 2^j \sum_{i=0}^{255} x_{i,m} * w_{i,n}$$

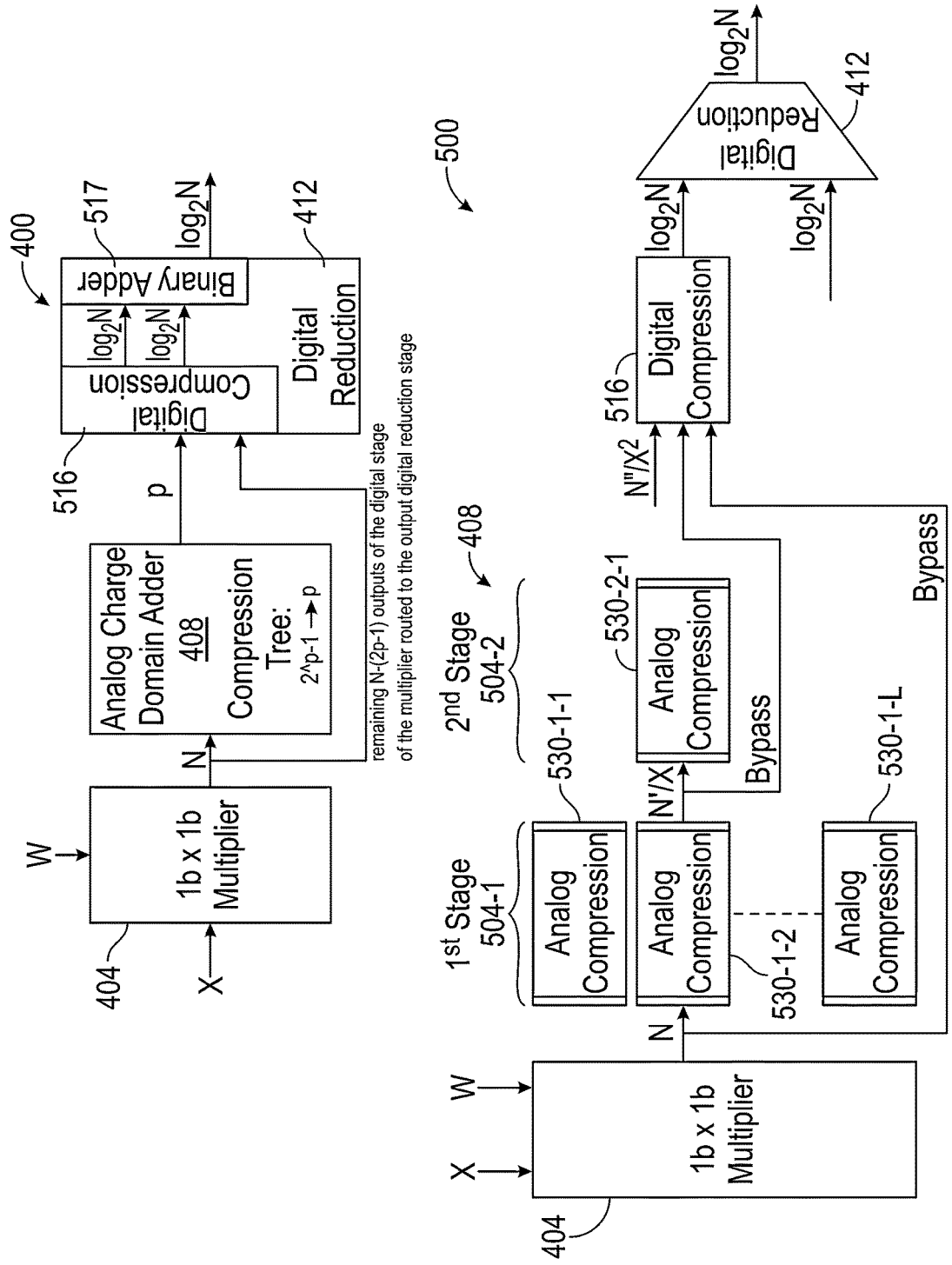

$$R_{out} = \sum_{0}^{M-1} x_i * w_i = \qquad \text{←680-1}$$

Output of First Stage Inner Product=C(u,j,k) of Weight j+k $$\sum_{u=0}^{A-1} \sum_{k=0}^{n-1} \sum_{j=0}^{n-1} 2^{j+k} \left( \sum_{i=0}^{2^p-2} x_{i+u(2^p-1)}[j] \, y_{i+u(2^p-1)}[k] \right)$$

$$\text{←680-2}$$

$$N'(v) = A \sum_{l=0}^{p-1} \sum_{k=0}^{n-1} \sum_{j=0}^{n-1} \delta_{l+j+k-v} \quad (2)$$

$$\text{←680-3}$$

$$R_{out} = \sum_{v=0}^{2n+p-2} 2^v \left( \sum_{u,j,k,l} c(u,j,k)[l] \, \delta_{l+j+k-v} \right) =$$

Output of Second Stage Inner Product $$\sum_{v=0}^{2n+p-2} 2^v \left( \sum_{0}^{B_v-1} \sum_{0}^{2^p-2} c(u',j',k')[l'] + \sum_{0}^{K_v-1} c(u',j',k')[l'] \right)$$

Where l'+j'+k'=v and N'(v)=Bv*(2^p-1)+Kv

INTEGER MATRIX MULTIPLICATION BASED ON MIXED SIGNAL CIRCUITS

BACKGROUND

The present invention relates to the electronic arts, and more specifically, to techniques and devices for integer matrix multiplication based on mixed signal circuits. Integer matrix multiplication is often performed in the digital domain. For example, a digital Wallace tree is conventionally used to perform integer matrix multiplication. While a Wallace Tree implementation has O(log n) reduction layers with relatively small propagation delays, digital implementations are, in general, characterized by substantial costs in terms of power and device area.

SUMMARY

Principles of the invention provide techniques for integer matrix multiplication based on mixed signal circuits. In one aspect, an exemplary method includes the operations of converting a dot product of two vectors x and w, where each element $x_i$ and $w_i$ has m bits, to $M=m^2$ one bit by one bit multiplications, where $x_{i,m}$ and $w_{i,m}$ each have 1 bit; setting a variable A to floor($M/(2^p-1)$) where M is a count of inputs, p is an analog resolution, and A is a count of rows of inner product summation circuits; designing a first stage based on $<A, n^2>$ where n is an input precision of the multiply-accumulate device; and counting inputs N'v and designing a second stage with ceiling (N'v/($2^p-1$))>Bv>floor(N'v/($2^p-1$)) analog inputs and Kv=N'v−($2^p-1$)*Bv, the counting and designing of the second stage being performed for each bit position v where v<2*n+p−1, Bv is a quotient of a division of N'v by $2^p-1$, and Kv is a remainder of the division operation.

In one aspect, a multiply-accumulate device comprises a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands; a mixed signal adder, the mixed signal adder comprising: one or more stages, at least one stage configured to input the N one-bit multiplication outputs, each stage comprising one or more inner product summation circuits; and a digital reduction stage coupled to an output of a last stage of the one or more stages and configured to generate an output of the multiply-accumulate device based on the L $m_1$-bit multipliers and the L $m_2$-bit multiplicands.

In one aspect, a non-transitory computer readable medium comprises computer executable instructions which when executed by a computer cause the computer to perform the method of converting a dot product of two vectors x and w, where each element $x_i$ and $w_i$ has m bits, to $M=m^2$ one bit by one bit multiplications, where $x_{i,m}$ and $w_{i,m}$ each have 1 bit; setting a variable A to floor($M/(2^p-1)$) where M is a count of inputs, p is an analog resolution, and A is a count of rows of inner product summation circuits; designing a first stage based on $<A, n^2>$ where n is an input precision of the multiply-accumulate device; and counting inputs N'v and designing a second stage with ceiling (N'v/($2^p-1$))>Bv>floor(N'v/($2^p-1$)) analog inputs and Kv=N'v−($2^p-1$)*Bv, the counting and designing of the second stage being performed for each bit position v where v<2*n+p−1, Bv is a quotient of a division of N'v by $2^p-1$, and Kv is a remainder of the division operation.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof (e.g. design processes) can be implemented in the form of a computer program product including a computer readable storage medium with computer usable program code for performing the method steps indicated. Furthermore, one or more embodiments of the invention or elements thereof can be implemented in the form of a system (or apparatus) (e.g., a computer) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

- improved, energy efficient mixed-signal Wallace tree reduction (compared to a conventional digital Wallace tree reduction);
- improved charge-sharing 1-bit adders (also referred to as a pop counters herein) for use in an inner product summation circuit;
- embodiments exhibiting a 5× improvement in energy efficiency (in terms of tera operations per second per Watt (TOPS/W)) at a similar device area compared to a conventional digital implementation;
- optimally sized and optimally combined unit components of full designs that operate at optimized metrics (such as power and/or area) for a given system-level specification (such as bit error rate);
- improved design process of integrated circuits resulting from the use of the improved, energy efficient mixed-signal Wallace tree reduction; and
- improved performance of integrated circuits designed using aspects of the invention, as compared to those not designed using aspects of the invention.

These and other features and advantages of the present invention will become apparent from the following detailed description of illustrative embodiments thereof, which is to be read in connection with the accompanying drawings.

BRIEF DESCRIPTION OF THE DRAWINGS

FIG. 4 is a high-level block diagram of an example compression tree, in accordance with an example embodiment;

FIG. 5 is a low-level block diagram of an example compression tree having a plurality of analog compression stages, in accordance with an example embodiment;

FIGS. 6B and 6C illustrate the general implementation of an example two-stage mixed-signal summation for arbitrary input sizes, in accordance with an example embodiment;

DETAILED DESCRIPTION

Figure 1A:
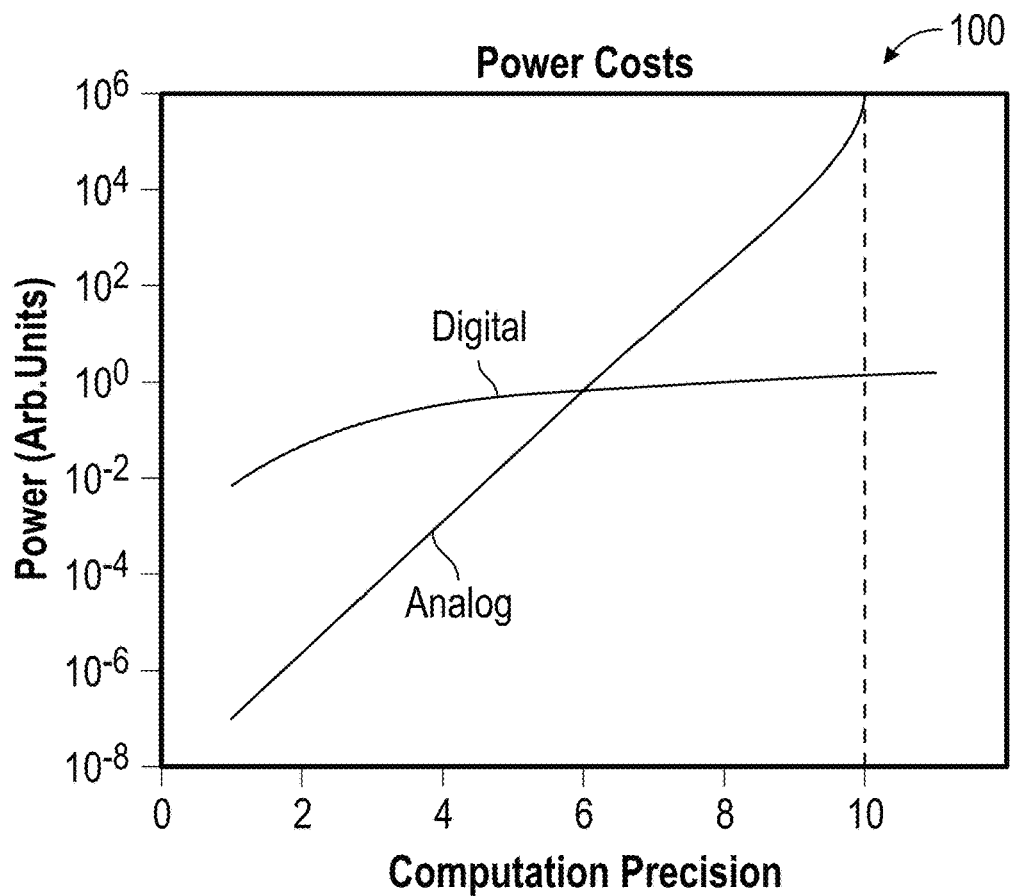
FIG. 1A is a graph of power versus output signal-to-noise ratio (SNR), in accordance with an example embodiment.

Generally, methods, devices, and systems for integer matrix multiplication based on mixed signal circuits (a combination of digital and analog domain circuits) are disclosed. Many workloads, including deep neural network (DNN) applications, require a large number of matrix multiplications which typically use multiply-accumulate operations. FIG. 1A is a graph 100 of power versus computation precision for digital and analog implementations of accumulate operations. As illustrated in FIG. 1A, embodiments of the present invention recognize a trend that accumulate operations are generally inefficient in digital embodiments, but extremely efficient in the analog (charge) domain. In one example embodiment, by combining digital techniques for multiplication and analog techniques for charge domain accumulation, an efficient multiply accumulate operation is attained.

Figure 1B:
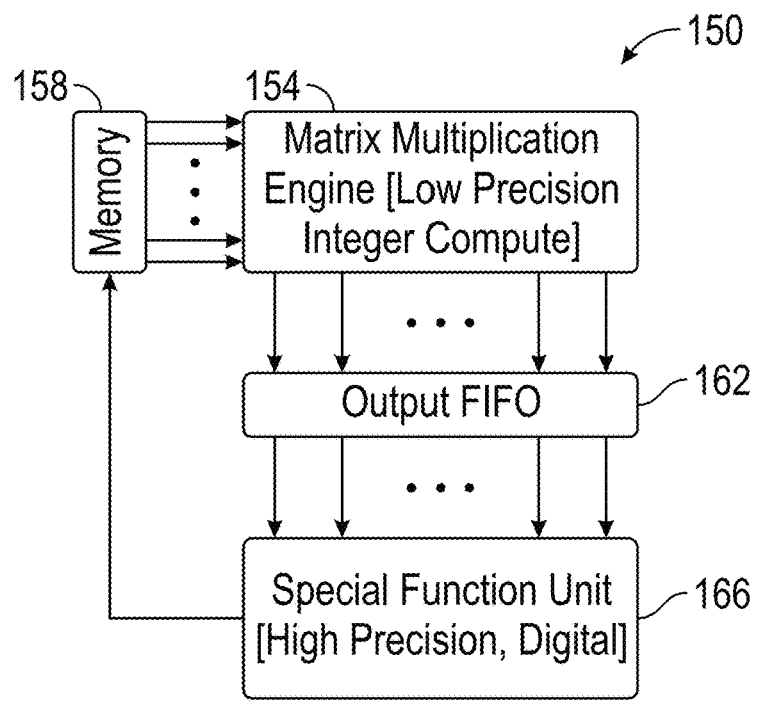
FIG. 1B is an example deep neural network accelerator, in accordance with an example environment.

FIG. 1B is an example deep neural network accelerator 150, in accordance with an example environment. The matrix multiplication engine 154 performs computations corresponding to convolution layers and fully-connected layers, which can typically be performed using low precision integer computations on data from memory 158. Results are then forwarded via output FIFO 162 to a special functions unit 166 that performs computations corresponding to activation functions, such as batch normalization, sigmoid functions, rectified linear unit functions and Soft-Max functions. These typically need to be performed in high-precision to preserve the accuracy of the deep neural networks that are mapped to the accelerator. Matrix multiplication represents the bulk of the computation in deep neural network workloads, and the matrix multiplication engine 154 can consume up to 80% of the total power consumed by the accelerator. The low-precision integer computations being performed in the matrix multiplication engine 154 can be performed by an engine operating at least partially in the analog domain, that can result in an accelerator with lower total power consumption compared to an accelerator that performs the entirety of its computations in the digital domain, utilizing digital circuits.

Figures 2A, 2B:
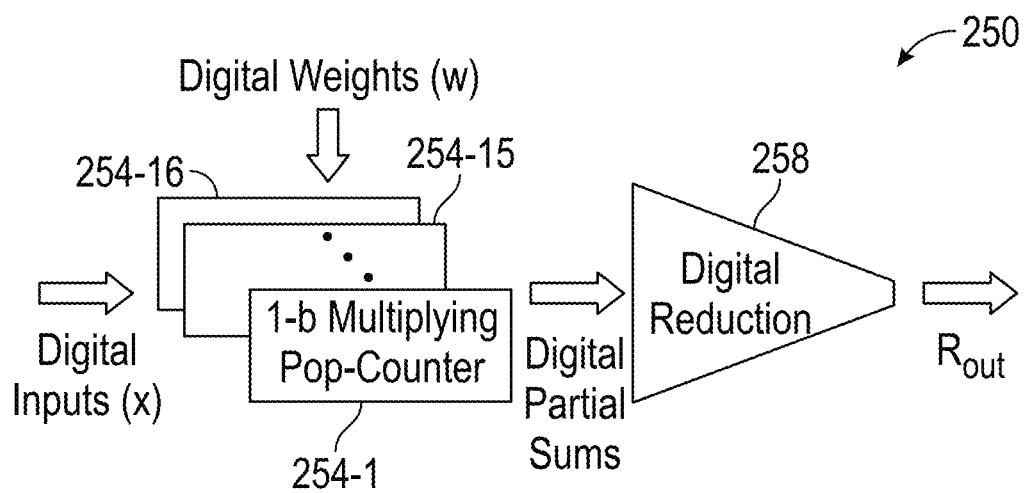
FIG. 2A illustrates a mathematical transformation to enable a multiply-accumulate operation based on mixed signal circuits, in accordance with an example embodiment.
FIG. 2B illustrates a high-level block diagram of a mixed signal circuit for performing integer matrix multiplication, in accordance with an example embodiment.

FIG. 2A illustrates a mathematical transformation 200 to enable a vector dot product (also referred to as an inner product herein; attained by a repeated multiply-accumulate operation) based on mixed signal circuits, in accordance with an example embodiment. In the example of FIG. 2A, each four bit by four bit product (4b*4b) is split into 16 one bit by one bit products (1b*1b). The left-side equation mathematically represents the dot product of two vectors x and w, each of size 256, where elements $x_i$ and $w_i$ each have 4 bits, and the right-side equation mathematically represents the 1b*1b multiplication, where $x_{i,m}$ and $w_{i,m}$ each have 1 bit. Dot products of vectors x and w, where elements $x_i$ and $w_i$ each have a different number of bits, are also supported, as described more fully below.

The bit-wise product is performed first, and then the summation is performed based on the weights of the bits. In essence, the 4-bit by 4-bit term is split into 16 one-bit products, and the one-bit products are accumulated (summed) and then appropriately scaled by a power of two by the outer summation to generate an aggregate sum. Based on power considerations, the 1b*1b multiplication is performed in the digital domain, the inner summation of the 1b*1b multiplication is performed in the analog domain, and the outer summation is performed in the digital domain. The inner summation is performed in the analog domain as this is where analog circuitry outperforms digital circuitry in terms of power. The 16-way addition is performed in the digital domain as there is little advantage to doing this in the analog domain. In one example embodiment, the inputs and outputs of the inner summation are digital. Other embodiments could use different splits between analog and digital domains.

FIG. 2B illustrates a high-level block diagram of a mixed signal circuit 250 for performing integer matrix multiplication, in accordance with an example embodiment. Each bit of the digital input $x_i$ and the corresponding bit representing the digital weight $w_i$ are input into one of the 16 1-bit multiplying pop-counters 254-1, . . . , 254-15, 254-16 (collectively referred to as pop-counters 254 herein). The digital partial sums (16 8-bit words=128 bits) generated by the pop-counters 254 are input into a digital reduction circuit 258 which performs the outer summation to generate the output $R_{out}$ (13 bits). Note that the analog accumulation is done at the same precision as a conventional digital accumulation.

The analog multiplying pop-counter circuit 254 can be designed such that its resolution is equal to or finer than a single level of the input, and with a specified noise margin. Hence, the nominal operation results in the same output result as that computed by a conventional digital circuit (with no precision degradation). Moreover, noise margin can be specified such that an arbitrary low bit error rate (BER) is obtained for a one pop-counter operation. This, in turn, translates to a controlled arbitrary low computation error for a full multiply-accumulate operation and for a full neural network operation, as depicted in FIG. 1B. Furthermore in this regard, assuming all noise is Gaussian, consider how much smaller the total noise sigma from ALL noise sources (namely CDAC component mismatch, thermal noise "kT/C" in capacitors and thermal noise in the comparator decision threshold) should be vs. CDAC voltage level separation (by 1 LSB) to achieve a given conversion BER target, with a ratio of 1:10 (for BER about 1e-9) being typical (one noise sigma being 1/10 of level separation to get such BER).

Figure 3:
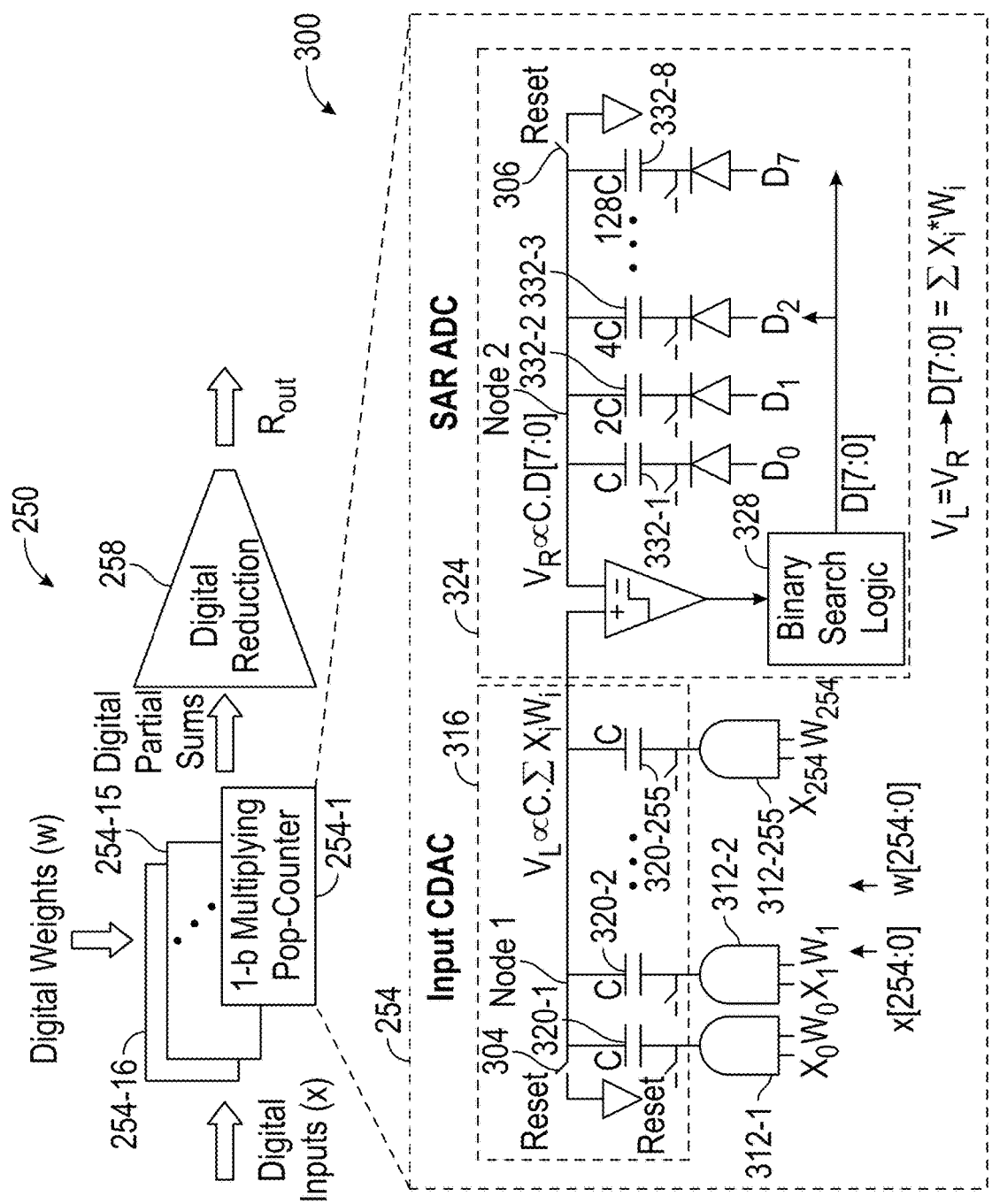
FIG. 3 is a schematic diagram of the example charge-sharing pop counter, in accordance with an example embodiment.

FIG. 3 is a schematic diagram of the example charge-sharing pop counter 300, in accordance with an example embodiment. The example charge-sharing pop counter 300 of FIG. 3 is an example of a 1-b multiplying pop-counter 254. As with the pop-counter 254, the inputs and outputs of the charge-sharing pop counter 300 are digital and the charge-sharing pop counter 300 performs 255 1b*1b multiplications and a single summation. Digital AND gates 312-1, 312-2, ..., 312-255 (collectively referred to as AND gates 312 herein) provide a multiplication operation $x_i*w_i$. A summation of the outputs of the AND gates 312 via charge sharing by capacitors 320-1, 320-2, ..., 320-255 (collectively referred to as capacitors 320 herein) is performed by input capacitive digital-to-analog converter 316 (also referred to as CDAC 316 herein).

During normal operation, a reset switch 304 is initially closed. Each of the capacitors 320 that correspond to an AND gate 312 that has a logic one output will charge via its lower plate and each of the capacitors 320 that correspond to an AND gate 312 that has a logic zero output will not receive any charge. The reset switch 304 is then opened, trapping the charge, if any, in the corresponding capacitor 320. Thus, the total charge at node 1 will represent the summation of the 1b*1b multiplications.

A successive approximation register analog-to-digital converter 324 (also referred to as SAR ADC 324 herein) then converts the total charge at node 1 to a digital value by matching the voltages $V_L$ at node 1 and $V_R$ at node 2 and generating the corresponding binary weighted output D[7:0]. The matching operation is performed by successively comparing the $V_L$ and $V_R$ voltages as binary search logic 328 generates different digital values on the binary weighted output D[7:0]. Note that the capacitors 332-1, 332-2, 332-3, ..., 332-8 (collectively referred to as capacitors 332 herein) are weighted in accordance with the corresponding digital data bit $D_i$. Thus, the capacitor 332-1 has a capacitive weight of one and the capacitor 332-8 has a capacitive weight of 128. The voltage $V_L$ is thus proportional to the input sum and the voltage $V_R$ is proportional to the value of the digital code D[7:0]. Once $V_L$ equals $V_R$, the value of the digital code represents the value of the summation of the multiplication of the input pairs.

FIG. 4 is a high-level block diagram of an example compression tree 400, in accordance with an example embodiment. The compression tree 400 is implemented using mixed signals and mixed signal circuits, that is, using digital and analog signals with circuits in the digital and analog domains. A conventional Classic Wallace tree using full adders performs a $2^2-1 \to 2$ compression. As illustrated in FIG. 4, a modification is made to the Wallace tree inner product of n-bit integer vectors X, W, each with M terms. As described above, the 1b*1b multiplier 404 is implemented in the digital domain. An analog charge domain adder 408 performs the analog summation and is, in essence, a compression tree. The analog charge domain adder 408 of the compression tree 400 performs a $2^p-1 \to p$ compression, where $2^p$ is the dynamic range of the analog charge domain adder 408. In the example of FIG. 3, the analog resolution p equals 8. Thus, the 255 inputs are compressed to eight outputs. If the resolution of the analog charge domain adder 408 is, for example, five bits, the analog implementation performs a $2^5-1 \to 5$ compression, or $31 \to 5$ compression. As the number of inputs of the analog block is one less than a power of 2, and the number of outputs of the digital stage, N, is usually a power of 2, the remaining $N-(2^p-1)$ outputs of the digital stage of the multiplier 404 are routed to the output digital reduction stage 412 where they are summed with the outputs of the analog stage 408.

FIG. 5 is a low-level block diagram of an example compression tree 500 having a plurality of analog compression stages 504-1, 504-2 (collectively referred to as stages 504 herein), in accordance with an example embodiment. More specifically, the compression tree can be built out of a combination of cascaded analog and digital stages. In general, the more efficient analog stages 504 should be placed first (note that the interfaces between analog stages 504 are digital). Using an arbitrary size of input precision and arbitrary size of the analog resolution, the widths of the different stages 504-1, 504-2 are determined. Similar to the embodiment described in FIG. 4, the remaining inputs of the first stage 504-1 that cannot be mapped to one of the analog compression circuits 530-x of the second stage 504-2 are bypassed and routed to the digital reduction stage 412. If the number of outputs of the digital stage is N and the number of inputs to the first stage 504-1 is $N'=L*(2^p-1)$ where L is the count of analog compression units 530 of the first stage 504-1, then (N-N') bits are bypassing the first stage 504-1. Similarly, (N-N")/X bits are bypassing the second stage 504-2.

For example, let X be the compression ratio of the analog stages 504 where X=p/log$_2$p. In one example embodiment, the output of the first stage 504-1 of the analog charge domain adder 408 feeds into the second stage 504-2 of the analog charge domain adder 408. As illustrated in FIG. 5, the N outputs of the 1b*1b multiplier 404 are reduced by the first stage 504-1 (including analog compression units 530-1-1, 530-1-2, ..., 530-1-L) to N'/X bits for input to the second stage 504-2 (including analog compression unit 530-2-1), where X is the number of inputs to the 1b*1b multiplier 404. The output of the second stage 504-2 is reduced to N"/X$^2$ bits (e.g. by a digital reduction circuit but see discussion below wherein outputs of an array of analog compressors (of both layers) (e.g. 530-2-1) should be perfectly applicable as inputs to the next block 516 "Digital Compression" as-is) and then compressed by digital compression circuit 516 prior to input to the digital reduction stage 412. Note that the interfaces between the stages 504-1, 504-2 are digital so that cascading multiple stages 504 is straight-forward. It is noted that a digital Wallace tree can be used if the required compression is not a multiple of the analog stage compression ratio, as described more fully below.

In one example embodiment, the digital reduction stage 412 converts an input bit array consisting of multiple bits having different binary weights (powers of 2), where there is at least one binary weight with two or more bits that have that weight, into a single binary number, i.e. a bit array where, for each binary weight, there is only one bit.

A digital reduction stage 412 generally includes two cascaded stages: a Wallace tree stage 516 (also referred to as digital compression stage 516 herein) and a binary adder stage 517 (see the right-hand side of FIG. 4). The first stage of the digital reduction stage 412 is only necessary when the input of a digital reduction stage 412 has, for at least one binary weight, more than two single-bit inputs, with an exception of the least significant bit (LSB), where three input bits with a weight of 1 may occur without a need to use a Wallace tree stage 516. The second stage (the binary adder stage 517) needs its input expressed as two binary numbers (that is, for each binary weight, there will be two single-bit inputs) with an exception of the least significant bit that has an extra single-bit input, known as a Carry-In, so that three input bits with a weight of 1 can be accepted.

Consider the splitting of a digital reduction stage 412 into the sub-stages of i) Wallace tree 516 (digital compressor not dealing with carry propagation) and ii) binary adder 517 (devoted mostly to carry propagation, an expensive digital function). As will be appreciated by the skilled artisan, Wallace tree stages 516 are commonly cascaded whenever data streams merge, since a given Wallace tree completes its function once it reduces its input data to two binary numbers. As soon as one adds MORE data to that data array, i.e. one has more than two bits of the same binary weight, the Wallace tree can proceed with more operations. Thus, a binary adder 517 is typically grouped with the LAST Wallace tree stage 516 of a cascade of multiple Wallace tree stages into a single "digital reduction stage" 412. The skilled artisan will appreciate that, since the outputs of an array of analog compressors (of both layers) (e.g. 530-2-1 in FIG. 5) should be perfectly applicable as inputs to the next block 516 "Digital Compression" as-is, block 516 then reduces its input data to two binary numbers, and then these two binary numbers are merged with more data from, e.g., 1×1b multipliers (since analog compressors typically cannot consume a small portion of that data initially due to mismatch in allowable data array width at their inputs), so more Wallace tree 516 operations are appropriate before binary adder 517 can complete the computation, and thus that last Wallace tree stage 516 and binary adder 517 are encapsulated in the box labeled 412 (digital reduction stage).

Figure 6A:
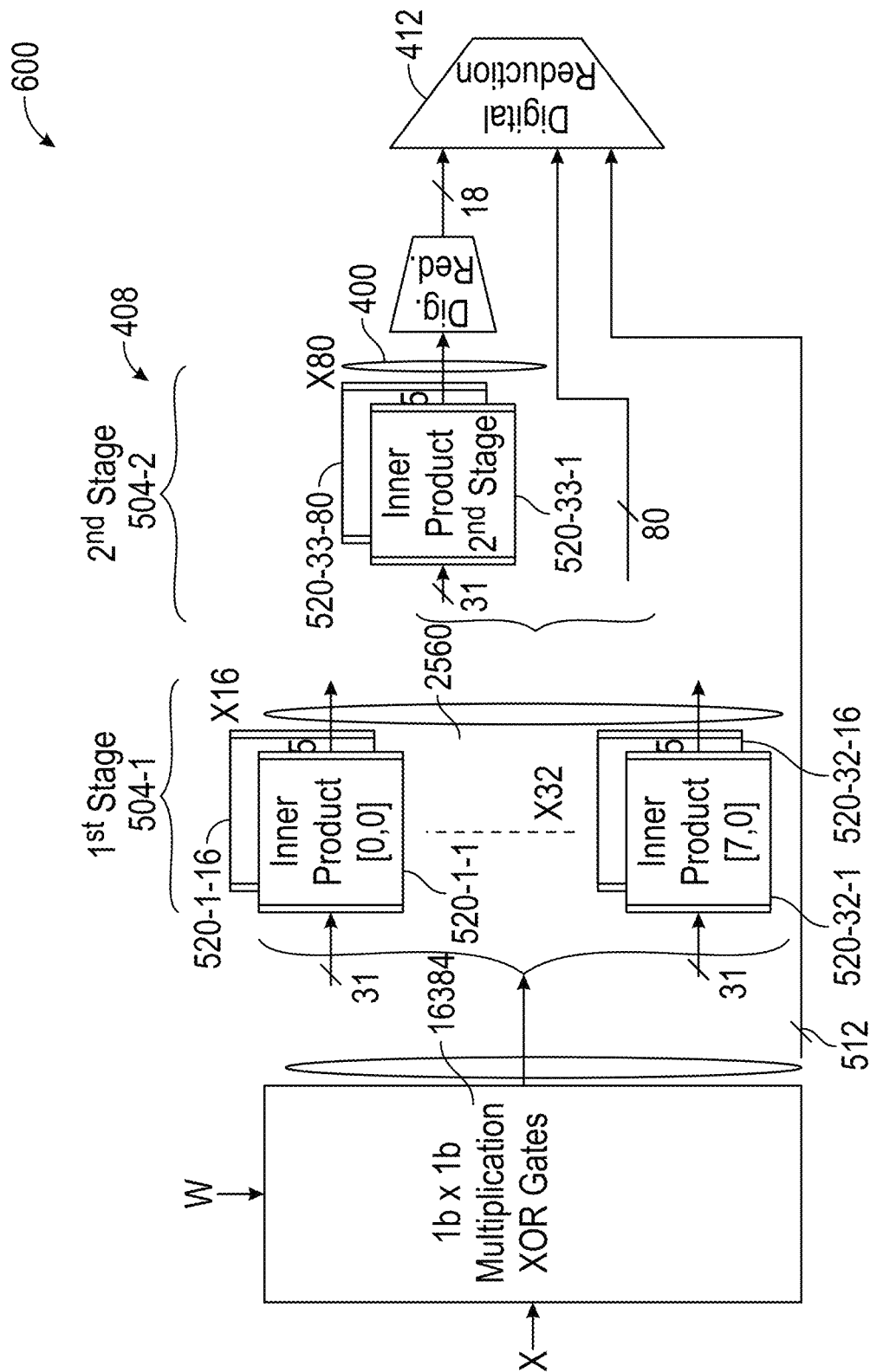
FIG. 6A is a low-level block diagram of an example compression tree, in accordance with an example embodiment.
Figure 6B:
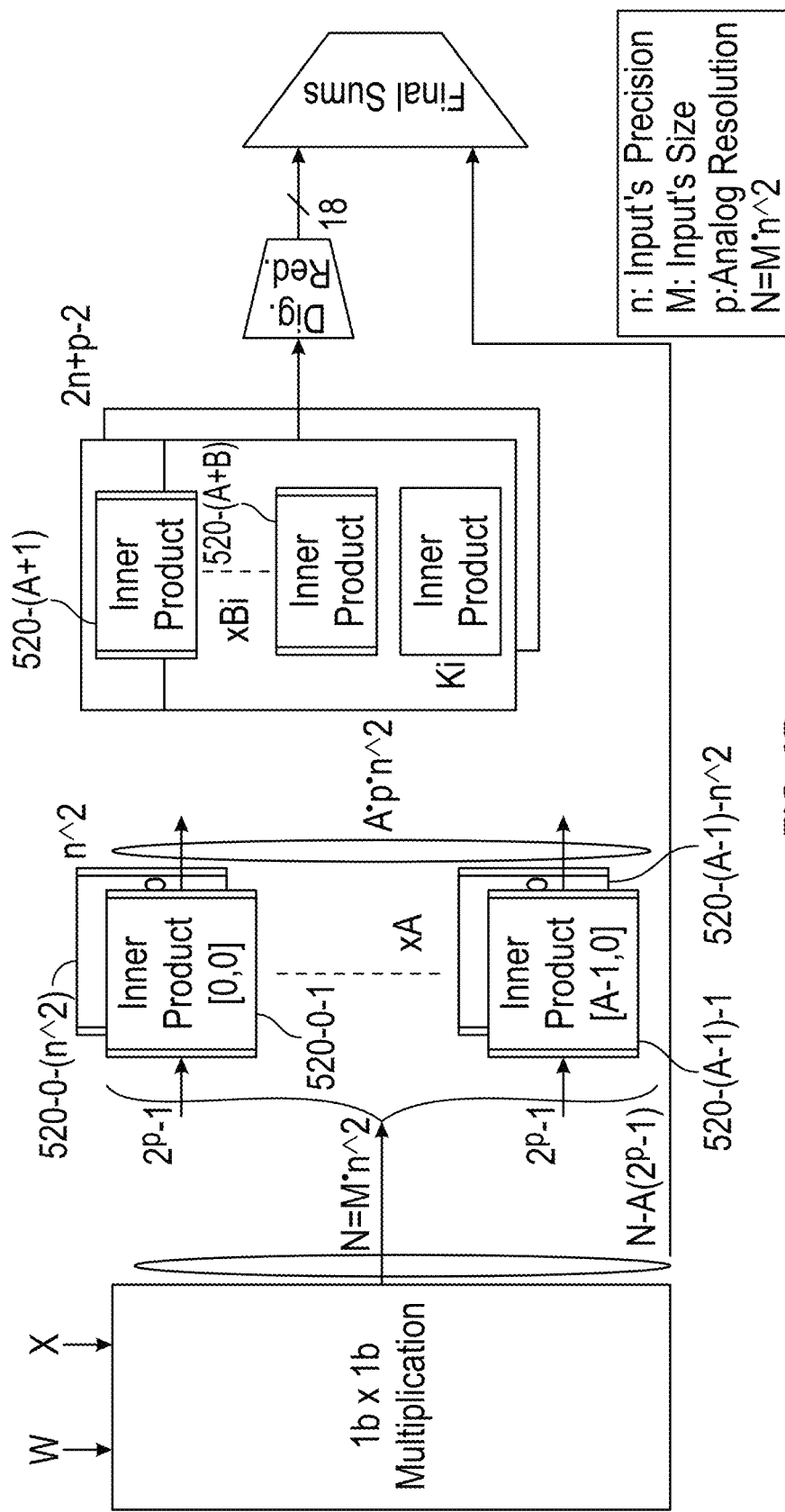

The rightmost block on both FIG. 6A and FIG. 6B can include, for example, a digital compression stage 412, including Wallace tree stage 516 and binary adder 517 such a seen in FIG. 4. Blocks further to the left from it can include more Wallace tree stages 516 that are cascaded, as explained above. The box 412 in FIG. 4 is explicitly depicted as a cascade of two boxes 516 and 517, and is typical of what can be done elsewhere as appropriate.

The digital compression stage 516 (Wallace tree stage 516) of a digital reduction stage includes 1-bit full adder (FA) gates that have three single-bit inputs (assumed having equal weight of 1) and two outputs called sum and carry, which have different weights: sum has the same weight as the corresponding inputs, i.e. 1, while carry has a ×2 larger weight, i.e. 2, and thus belongs to the next binary digit. By passing three equally weighted bits thru one full adder, a reduction of the total number of bits by one is achieved, from three to two. An important property of a Wallace tree is that the number of cascaded FA gate layers necessary to complete the compression process (when, for each binary weight, there is no more than two single-bit outputs, with the aforementioned exception for the LSB) is generally small, particularly when its N-bit input array is presented as a set of M K-bit binary words (M=N/K), then the number of FA layers is log(M) while the total number of FA gates within those layers is N−2*(K+$\log_2$(M)), where K+$\log_2$(M) is the number of bits in each output operand after compression completes (it always takes one FA gate to compress the input N-bit array by one bit). Once the input array is compressed into two binary words (plus, optionally, one extra LSB bit) by the Wallace tree, further digital reduction needs a different strategy since it involves a process of carry propagation where, for reduction of latency, a binary adder with an accelerated carry propagation would commonly be employed, such as a Kogge-Stone Adder (KSA), which is a technique that allows completion of the process of the addition of two K-bit numbers by cascading only $\log_2$(K) gate stages. In contrast, in the most basic architecture ("carry ripple through") that uses a uniform chain of K FA gates, K stages would be used to complete the addition, a significant difference when K is large (such as greater than 16 bits).

FIG. 6A is a low-level block diagram of an example compression tree 600, in accordance with an example embodiment. The compression tree 600 is based on a specified input precision (n=4), input size (M=1024), and compression ratio (p=5). In the example embodiment of FIG. 6A, the output of the first stage 504-1 is an optimal fit for the second stage 504-2, where there are $2^p$ rows of inner products summation circuits 520-1-1-1, . . . , 520-1-1-16, . . . , 520-1-32-1, . . . , 520-1-32-16, 520-2-1-1, . . . , 520-2-1-80 (collectively referred to as inner products summation circuits 520 herein) and M=$2^{(2p)}$ inputs. The implementation of the inner product summation circuit 520 is detailed in FIGS. 9 and 10. The output of the first stage 504-1 is optimal as it corresponds directly to a multiple number of the inner product summation circuits 520 of the second stage 504-2 (that is, an integer number of second stage inner product summation circuits 520). Note that from an implementation perspective, in one or more embodiments it may be appropriate to limit the count of inputs for the charge-sharing pop counter 300 to, for example, 31 inputs.

General Reduction Method

In the case where M≠$2^{2p}$ (that is, where the count of outputs of the stage 504-1 does not correspond to an integer number of inner product summation circuits 520 of the stage 504-2), the partial products generated at the end of the first stage 504-1 will be partially combined with analog compression and partially combined with a digital Wallace tree. The analog stages 504-1, 504-2 can accept $2^p$−1 inputs, or a lower number, at the cost of energy efficiency (e.g., "zeroed" inputs and/or the use of a reduced most significant bit (MSB) in the successive approximation register (SAR) feedback). Note that one could use three or more stages 504 but, as the width (which is proportional to power) of each stage 504 is reduced by $2^p$−1/p at each stage 504, the optimization of further stages 504 results in an exponentially lower power improvement and, thus, becomes less effective to implement in analog.

FIGS. 6B and 6C illustrate the general implementation of an example two-stage mixed-signal summation for arbitrary input sizes, in accordance with an example embodiment. In the general implementation of FIGS. 6B and 6C, n denotes the precision (the number of bits) of the inputs (assuming identical weights and data precision), M denotes the number of data inputs X and the number of weight inputs W (size(W)=size(X)=M), p denotes the resolution of each of the analog compression circuits (i.e., each inner product summation circuit 520-1-1-1, . . . , 520-1-1-$n^2$, . . . , 520-1-A-1, . . . , 520-1-A-$n^2$, . . . , 520-2-1, . . . , 520-2-(1+B)

has $2^{p-1}$ 1-bit inputs and one p-bit output). The output of the second stage 520-2 comprises a number of outputs $\Sigma_i Bi$ each of p bits as well as $\Sigma_i Ki$ of variable bit count. These outputs can be added digitally. Each output is multiplied by $2^v$ where v is as defined in FIGS. 8A and 8B. This multiplication can be implemented with zero padding. Each of the outputs can be added through full-adder logic gates to reduce to a single signal of a number of bits $\log_2(M \cdot n^2)$. As the number of inputs of the first stage 504-1 is a multiple of $2^p-1$, while the output N of the first stage 504-1 is typically a power of 2, a number $N-A(2^p-1)$ of the outputs of the digital multiplication circuit 404 is connected to the final summation stage. The final summation stage reduces the $N-A(2^p-1)$ 1-bit inputs to one $\log_2(N-A(2^p-1))$-bit output though a conventional Wallace-tree reduction, as previously described above. Finally, the two signals are added through full-adders gates to generate one output of $\log_2(M \cdot n^2)$ bits. It is worth noting that, as the digital compression is performed in the second stage 504-2, there is no need for a bypass of the second stage 504-2, unlike the case of FIG. 5, i.e. N'=N''. As noted above, the multiplication is implemented digitally bitwise. This results in a number N of outputs $N=M*n^2$. For each of the $n^2$ combinations of bitwise products of weights j and k, the terms can be grouped and routed to a set of first stage inner product summation circuits 520. For each combination, there are M input terms and, hence, A=floor(M/$(2^p-1)$) inner product summation units (each with $2^p-1$ inputs) are provided for each of the $n^2$ combinations. Hence, the output of the first stage 504-1 is composed of $A*n^2$ terms of p bits each, and of binary weight j+k, as summarized in equation 680-1 of FIG. 6C.

Each of the p-bit outputs, denoted as C(u,k,j), can be broken bitwise for further summation. If we note l as the index of the l-th bit of C(u,k,j), the total bit weight of the term is v=l+j+k, ranging from 0 to 2n+p−3. For each v, there are N'v individual terms of weight v out of the $A*p*n^2$ bit outputs of the first stage 504-1.

The number of terms N'v can be derived from equation 680-2 of FIG. 6C. N'v corresponds to A times the number of combinations of (l, j, k) chosen in [0; p−1]×[0; n−1]×[0; n−1] of sum l+j+k=v. For example, for A=1, n=2, and p=5, N'0=1, N'1=3, N'2=N'3=N'4=4, N'5=3, and N'6=1.

Figure 8A:
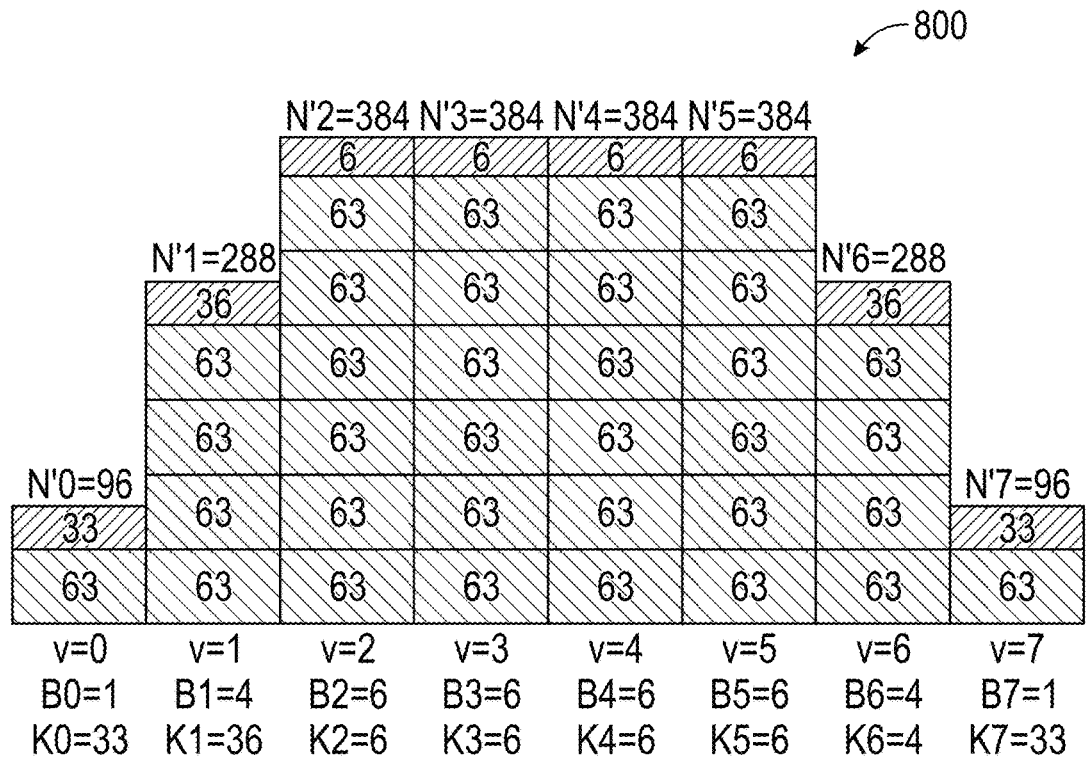
FIG. 8A illustrates a first graphical representation of the count of terms for the second stage, in accordance with an example embodiment.
Figure 8B:
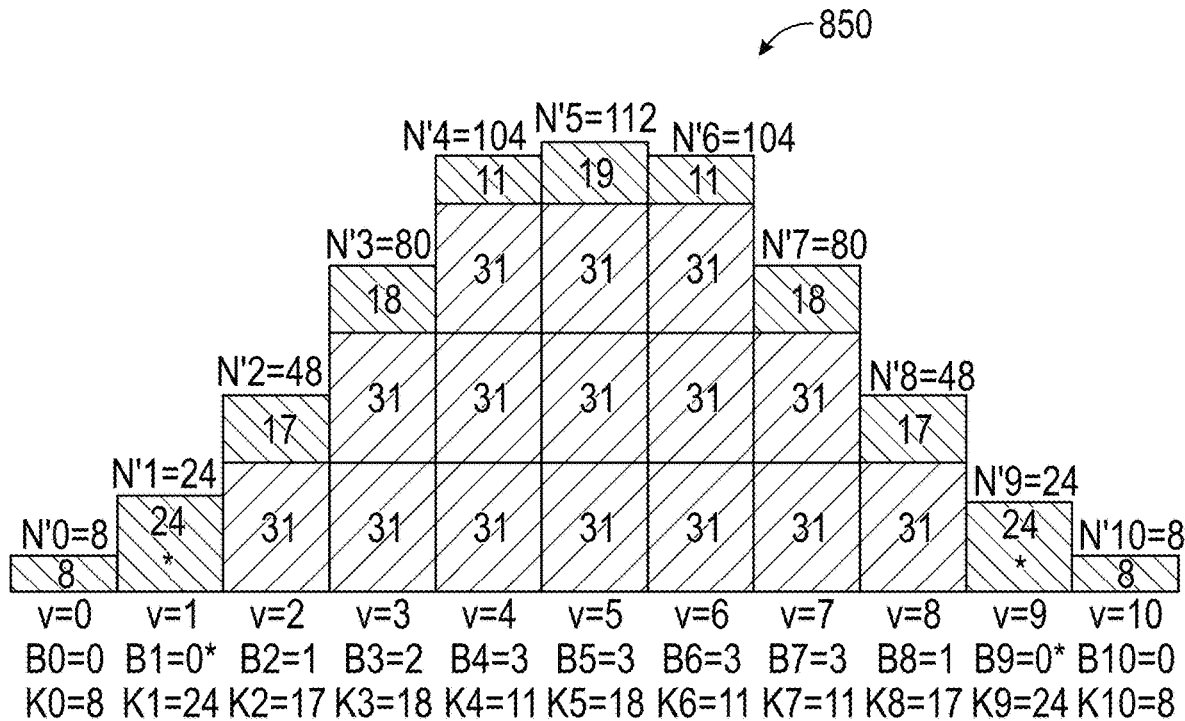
FIG. 8B illustrates a second example graphical representation of the count of terms for the second stage, in accordance with an example embodiment.

The first part of equation 680-3 of FIG. 6C illustrates how the outputs of the first stage 504-1 are broken bit by bit (terms C(u, j, k)[l]) and are grouped in the second stage 504-2 by identical binary weights v and summed together by group. As seen in the second part of equation (3), the sum for each term N'v can be broken into Bv groups of $2^p-1$ inner products of individual inputs C(u', j', k')[l'] and Kv additional terms, summed in a conventional digital manner (i.e. $N'v=Bv*(2^p-1)+Kv$). FIGS. 8A and 8B, described more fully below, illustrate different combinations of parameters resulting in different N', B and K combinations. The outputs of each same level v can then be summed digitally, then combined with the outputs of the different levels, as depicted in the outer sum of equation 680-3.

Figure 7:
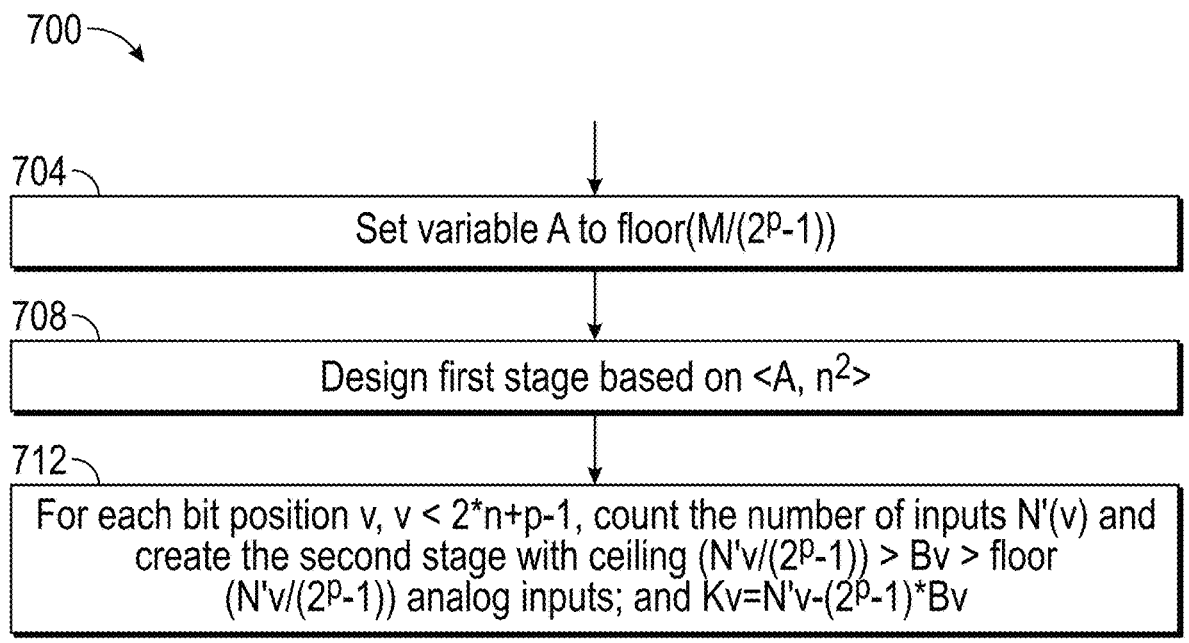
FIG. 7 is a flowchart for an example method to determine the size of the stages based on a given number M of inputs, in accordance with an example embodiment.

FIG. 7 is a flowchart for an example method 700 to determine the size of the stages 504-1, 504-2 based on a given number M of inputs, in accordance with an example embodiment. The method 700 is beneficial to, for example, implement the design of the mixed signal circuit 250 for multiple values of n and M and to improve productivity when, for example, multiple designs are being created. The count of output bits of the multiplication stage is $N=M*n^2$. Given that each inner product summation circuit 520 supports $2^p-1$ input bits for a 1b*1b multiplication, there are $M/(2^p-1)$ "rows" of inner product summation circuits 520, where each "row" includes $2^p$ inner product summation circuits 520.

In one example embodiment, variable A is set to floor $(M/(2^p-1))$ where M is the count of inputs (operation 704), that is, variable A (the count of "rows" of inner product summation circuits 520) is set to M divided by the compression ratio of stage 504-1 ($2^p-1$), which is based on the analog resolution p. The first stage 504-1 is designed based on <A, $n^2$> (operation 708). For each bit position v, v<2*n+p−1, count the number of inputs N'v and create the second stage 504-2 with ceiling $(N'v/(2^p-1))>Bv>floor(N'v/(2^p-1))$ analog inputs; and $Kv=N'v-(2^p-1)*Bv$ (operation 712). For each v, $N'v=Bv*(2^p-1)+Kv$; thus, Bv is the quotient of the division of N'v by $2^p-1$ and Kv is the remainder of that division. If less than one full inner product summation circuit 520 is needed, digital implementation of the inner product summation circuit 520 is used.

FIG. 8A illustrates a first graphical representation 800 of the count of terms for the second stage 504-2, in accordance with an example embodiment. In the example of FIG. 8A, n=2, p=6, M=6,144 (6144 inputs), N=24,576 (24,576 outputs from stage 504-1), A=96 (96 "rows" of inner product summation circuits 520 in stage 504-2), and $$N'v=96\Sigma_{l=0}^{5}\Sigma_{k=0}^{1}\Sigma_{j=0}^{1}\delta_{l+j+k-v}.$$

The eight bins labeled v=0 to v=7 represent the count of terms corresponding to each weight value for the stage 504-2. Bin v=0 represents the count of terms for the product of the two least significant bits, bin v=7 represents the count of terms for the product of the two most significant bits, and the remaining bins represent the count of terms of the remaining combinations of input bits. Since there are 96 "rows" of inner product summation circuits 520 for stage 504-2, there are 96 partial sums in bins v=0 and v=7, 288 partial sums in bins v=1 and v=6, and 384 partial sums in bins v=2 through v=5. As illustrated in FIG. 8A, most of the summations are performed in the analog domain (lower blocks having a upper-left to lower-right cross-hatching); the summations that exceed a multiple of the count of inputs for an inner product summation circuit 520 or that require a small amount of power to perform are handled in the digital domain (upper blocks having a lower-left to upper-right cross-hatching).

FIG. 8B illustrates a second example graphical representation 850 of the count of terms for the second stage 504-2, in accordance with an example embodiment. In the example of FIG. 8B, n=4, p=5, M=256 (256 inputs), N=4096 (4,096 outputs from stage 504-1), A=8 (8 "rows" of inner product summation circuits 520 in stage 504-2), and $$N'v=8\Sigma_{l=0}^{4}\Sigma_{k=0}^{3}\Sigma_{j=0}^{3}\delta_{l+j+k-v}.$$

The eleven bins labeled v=0 to v=10 represent the count of terms corresponding to each weight value for the stage 504-2. Bin v=0 represents the count of terms for the product of the two least significant bits, bin v=10 represents the count of terms for the product of the two most significant bits, and the remaining bins represent the count of terms of the remaining combinations of input bits. Since there are 8 "rows" for stage 504-2, there are 8 partial sums in bins v=0 and v=10, 24 partial sums in bins v=1 and v=9, and the like. As illustrated, many of the products are handled in the analog domain; the summations that exceed a multiple of the count of inputs for an inner product summation circuits 520 or that require a small amount of power to perform are handled in the digital domain. The cross hatchings are reversed in FIG. 8B as compared to FIG. 8A.

Figure 9:
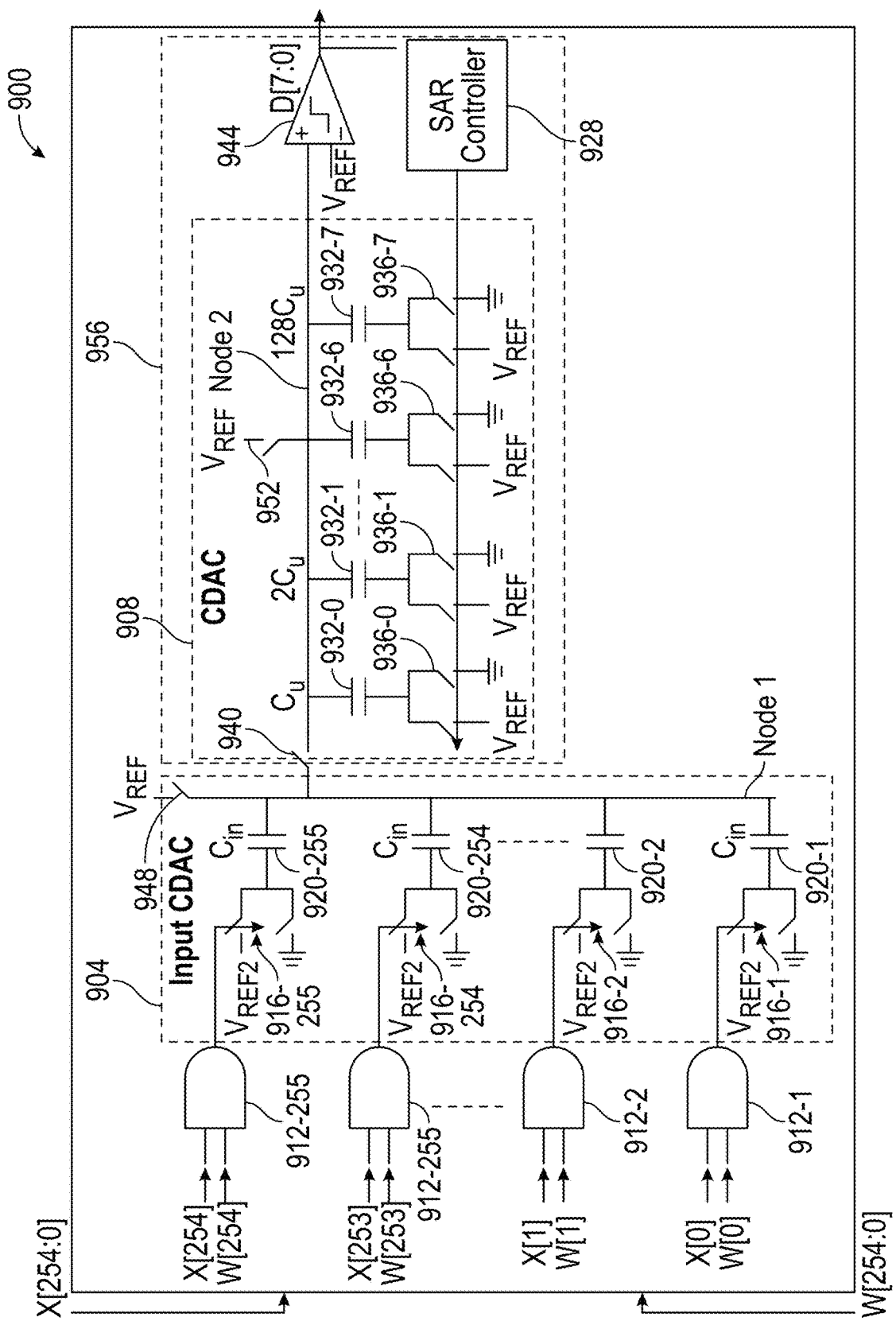
FIG. 9 is a schematic diagram of a first example charge-sharing pop counter, in accordance with an example embodiment.

FIG. 9 is a schematic diagram of a first example charge-sharing pop counter 900, in accordance with an example embodiment. The example charge-sharing pop counter 900 of FIG. 9 is an example of a 1-b multiplying pop-counter 254. The inputs and outputs of the charge-sharing pop counter 900 are digital and the charge-sharing pop counter 900 performs 255 1b*1b multiplications and a summation. In one example embodiment, the charge-sharing pop counter 900 includes an input capacitive DAC 904 (also referred to as capacitive digital-to-analog converter (CDAC) 904 herein) and a feedback successive approximation register analog-to-digital converter 956 (also referred to as SAR ADC 956 herein). The SAR ADC 956 is reduced based on $C_u=C_{in}/4$ (the reference voltages are adjusted according to $V_{REF2}=(5/4) V_{REF}$). The operation of the charge-sharing pop counter 900 can be impacted by non-linearity of the comparator input capacitance. Note that the circuit embodiments can be implemented as either differential or single-ended.

Digital AND gates 912-1, 912-2, . . . , 912-254, 912-255 (collectively referred to as AND gates 912 herein) provide a multiplication operation $x_i*w_i$. A summation of the outputs of the AND gates 912 is performed via charge sharing by capacitors 920-1, 920-2, . . . , 920-254, 920-255 (collectively referred to as capacitors 920 herein) by input CDAC 904.

Initially, the outputs of the AND gates 912 represent the results of the multiplication operations and control switch pairs 916-1, 916-2, . . . , 916-254, 916-255 (essentially a single pole, double throw switch; collectively referred to as switch pairs 916 herein). Each of the capacitors 920 that corresponds to an AND gate 912 that has a logic one output will charge via one plate and each capacitor of the capacitors 920 that correspond to an AND gate 912 that has a logic zero output will not receive any charge. During that first "sampling" step, the node 1 reset switch 948 (also referred to as input precharge switch 948 herein) is closed and the transfer switch 940 is open. The node 2 is reset at the same time via a reset switch 952 (also referred to as output precharge switch 952 herein). Hence the voltages at node 1 and node 2 are both reset to a known value. Then, during the "transfer" step, the transfer switch 940 and reset switch 952 are open, leaving node 1 and node 2 floating. Immediately after, the left inputs of the capacitors 920 are brought to a fixed value (e.g. all the control switch pairs 916 are connected to ground). This results in a voltage at node 1 proportional to the sum of the inputs applied during the previous sampling stage. During the transfer step, the transfer switch 940 is then closed equating the voltages on nodes 1 and 2. This results in a voltage at node 2 proportional to the input code, attenuated by a factor equal to Cin/(Cin+Cu). Hence, the value of Cu is chosen to be smaller than that of Cin (e.g. Cu=1/4 Cin).

The SAR ADC 956 converts the total charge at node 2 to a digital value by performing a binary search and matching the voltages $V_2$ at node 2 and $V_{REF}$ to generate a binary weighted output D[7:0]. The matching operation is performed by removing charge from node 2 until it is all removed via output switch pairs 936-0, 936-1, . . . , 936-6, 936-7; the SAR ADC 956 successively compares the $V_2$ and $V_{REF}$ voltages as the SAR controller 928 generates different digital values on the binary weighted output D[7:0]. Note that capacitors 932 are weighted in accordance with the corresponding digital data bit $D_i$. Thus, the capacitor 932-0 has a capacitive weight of one, the capacitor 932-1 has a capacitive weight of two, the capacitor 932-6 has a capacitive weight of 64, and the capacitor 932-7 has a capacitive weight of 128. Once $V_2$ equals $V_{REF}$ as determined by comparator 944, the value of the digital code represents the summation of the multiplication of the inputs.

In the example embodiment of FIG. 9, as the input stage of the charge-sharing pop counter 900 (including AND gates 912 and the input capacitive DAC 904) is only used during two operating cycles, while the SAR stage (the SAR ADC 956 includes the successive approximation register digital-to-analog converter (SAR DAC) 908, the comparator 944, and the SAR controller 928) is used during p+2 cycles (such as 10 cycles in the example embodiment of FIG. 9), a single input stage can serve multiple SAR stages, with the transfer switch 940 connecting the input stage alternatively to different SAR stages, improving the processing bandwidth.

Note that the absolute level ("common mode") of the voltages on nodes 1 and 2 can be adjusted by changing the reference voltage at which the nodes are reset (the top input of the reset switch 948 and the reset switch 952) and/or by changing the fixed digital code applied to the left plate of the capacitors 920 and/or the bottom plate of capacitors 932 during the transfer stage. This adjustment can be used to guarantee that the voltage at nodes 1 and/or 2 does not exceed a given maximum voltage or go below a given minimum voltage.

Figure 10:
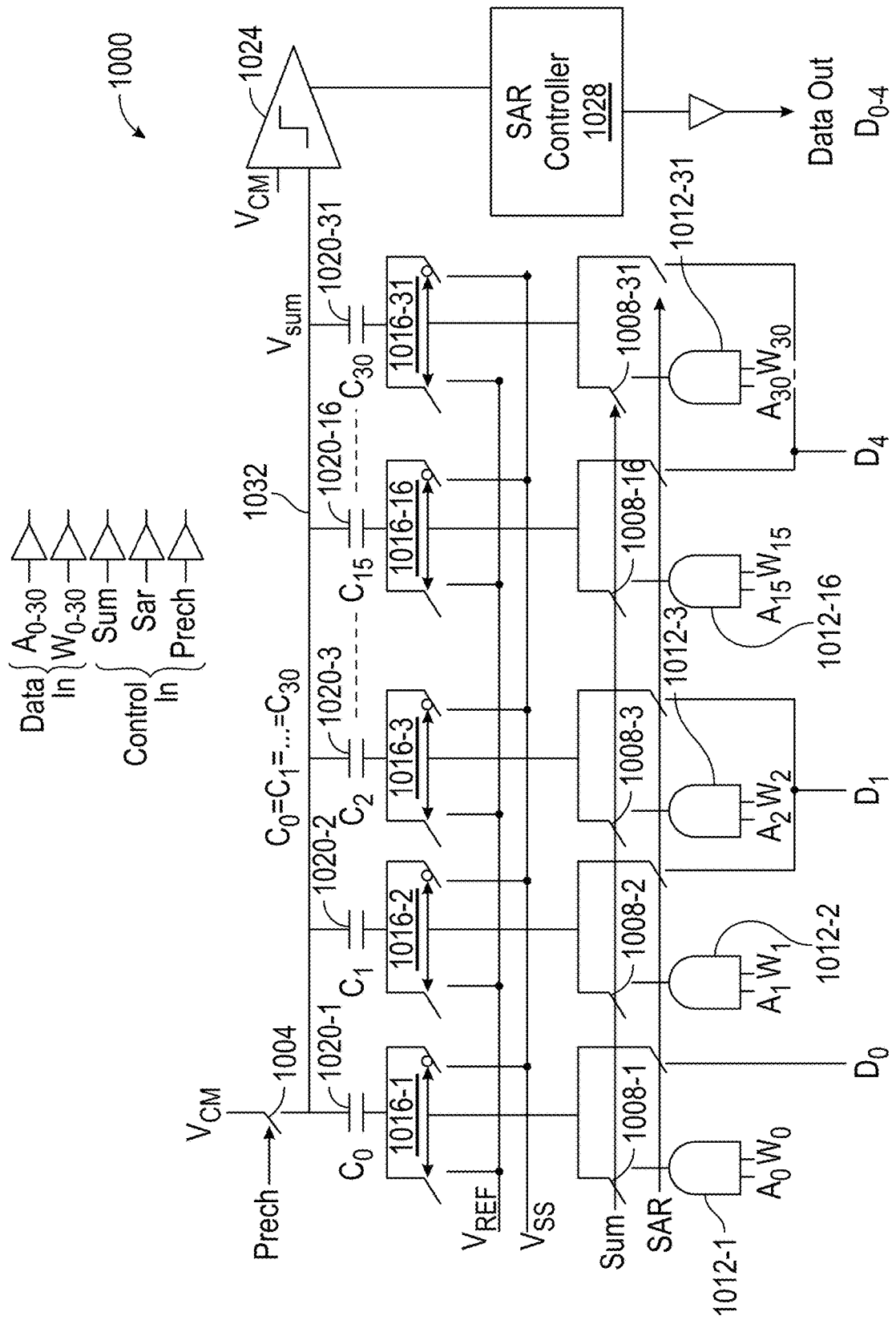
FIG. 10 is a schematic diagram of a second example charge-sharing pop counter for the inner product summation circuit, in accordance with an example embodiment.

FIG. 10 is a schematic diagram of a second example charge-sharing pop counter 1000 for the inner product summation circuit 254, in accordance with an example embodiment. The embodiment of FIG. 10 exhibits more non-linearity tolerance than the embodiment of FIG. 9, as the same circuits are used for input conversion and feedback approximation. Note that embodiments of the charge-sharing pop counter 1000 can be either differential or single-ended.

As illustrated in FIG. 10, p=5 (31 inputs). The bottom plate of each of capacitors 1020-1, 1020-2, 1020-3, . . . , 1020-16, . . . , 1020-31 (collectively referred to as capacitors 1020 herein) is coupled to a corresponding pair of transmission gates 1016-1, 1016-2, 1016-3, . . . , 1016-16, . . . , 1016-31 (collectively referred to as transmission gates 1016 herein), where one gate of each pair of the transmission gates 1016 is coupled to $V_{SS}$ (ground) and the other gate of the pair of the transmission gates 1016 is coupled to $V_{REF}$. The top plates of all capacitors 1020 are connected to a common node net 1032. A precharge switch 1004 is configured to connect the common node net 1032 to a $V_{CM}$ voltage source (which is independent of $V_{REF}$). The voltage $V_{CM}$ is set to the natural common-mode voltage of the comparator 1024, the voltage at which the comparator 1024 is most likely to have the best sensitivity/noise characteristics. The comparator 1024 is differential; its negative node is attached to the common node net 1032 of the capacitor bank, while its positive node is connected directly to a $V_{CM}$ voltage source.

As illustrated in FIG. 10, the same bank of capacitors 1020 is utilized for both input summation and SAR conversion. This alleviates the issues related to charge sharing attenuation as well as capacitor non-linearity. During the input summation phase, the capacitors 1020 are controlled individually, while during the SAR conversion operations, the capacitors 1020 are controlled in a binary weighted manner.

During the first operating phase, the precharge switch 1004 is closed, such that $V_{SUM}$, the voltage at common node net 1032, is equal to $V_{CM}$ and the inputs of the comparator 1024 are effectively electrically shorted. Simultaneously, the product of each pair of inputs $A_i$, $W_i$ is computed by digital AND gates 1012-1, 1012-2, 1012-3 . . . , 1012-16, . . . , 1012-31 (collectively referred to as AND gates 1012 herein)

and applied to the bottom plate of each of the capacitors 1020 individually by switching the sum switch of each switch pair 1008-1, 1008-2, 1008-3 . . . , 1008-16, . . . , 1008-31 (collectively referred to as switch pairs 1008 herein) to be closed and the SAR switch to be open. The bottom plate of each of the capacitors 1020 is charged to either $V_{REF}$ or 0V at the end of the first phase of operation, depending on the logical output of the corresponding AND gate 1012. Thus, each capacitor 1020 stores the charge $Q_i=C(A_i*W_i*V_{REF}-V_{CM})$.

During the second operating phase, the precharge switch 1004 is first opened and the common node net 1032 connecting the top plates of the capacitors 1020 is allowed to electrically float. Next, the switch pairs 1008 are configured to pass the output of the SAR controller 1028 (the sum switch of each switch pair 1008 is opened and the SAR switch of each switch pair 1008 is closed) such that the data output of the SAR controller 1028 controls the configuration of the transmission gates 1016. The capacitor bank is configured as an array of five binary weighted capacitances in this phase, i.e. the first capacitor 1020-1 is connected to the least significant bit (LSB) D0 output of the SAR controller 1028, capacitors 1020-2 and 1020-3 are connected to the second bit D1 output of the SAR controller 1028, . . . and capacitors 1020-15 to capacitors 1020-31 are connected to the most significant bit (MSB) D4. In this second cycle of the second phase, the output code of the SAR controller 1028 is set to a mid-value, i.e. D<4:0>=10000b. As a result, half of the capacitors 1020 are connected to $V_{REF}$ and the common node net 1032 $V_{SUM}$ value is proportional to $V_{REF}(15-\Sigma A_i*W_i)$.

Next, the comparator 1024 makes the first MSB binary decision equal to A. The DAC state changes from 10000b to A1000b, i.e. a logic one is shifted from the MSB to the next MSB, while output A of the comparator 1024 is written to the MSB. It can be seen that if A=1, the transition from 10000b to 11000b is +25% full-scale range (FSR) while, if A=0, the transition from 10000b to 01000b is −25% FSR.

Then, the process repeats, i.e. the second MSB decision equal to B is made and the DAC goes from A1000b to AB100b, moving +/−12.5% of FSR accordingly, and so on. It takes a total of 5 steps to produce the 5-bit binary weighted code. After all decisions are made, the common node net 1032 connecting the top plates of the capacitors 1020 is brought close to $V_{CM}$ via a binary search. The precharge switch 1004 is closed and the comparator 1024 may make an extra decision to calibrate its offset (optional). Then the switch pairs 1008 assume a new position based on a new input data vector, and the circuit is ready to perform the next multiply-accumulate operation.

Note that the voltage levels $V_{SUM}$ on the common node net 1032 are in the form of $V_{CM}+n\cdot VLSB$, where VLSB is the unit voltage step during one LSB actuation of the SAR controller 1028 and n is a (positive or negative) integer. Hence, this can result in the voltage being equal to exactly $V_{CM}$, placing the comparator 1024 in a metastable position, (comparing two equal inputs). This can be solved by adjusting the offset of the comparator 1024 to VLSB/2 or by adding a voltage offset to the common node net 1032 of VLSB/2 via an additional controlled capacitor of value C0/2.

In some example embodiments, the capacitor of effective value C0/2 can be obtained by placing two capacitors of value C0 in series, or by operating two capacitors Ca and Cb of value C0 in the following steps: in a first step Ca is charged with a voltage Vref and charge Q=Vref·C0 and Cb with a voltage 0. Then, in a second step, the two capacitors are connected in parallel, each acquiring a charge Q/2. Then, either one of those two capacitors can be connected to the common node net 1032, providing an effecting voltage offset of VLSB/2. The second approach has the benefit of mitigating the effect of the capacitors' non-linearity.

The single-ended circuits presented in FIGS. 9 and 10 can also be implemented in a differential manner. In that case, the sets of capacitors 920, 932, 1020 is duplicated, each connected to one of the two inputs of the comparators 944, 1024 (rather than having one of the inputs connected to a fixed reference). The capacitors 920, 932, 1020 are controlled in a differential manner, i.e. for each capacitor bottom plate which is connected to the 0V level, the capacitor 920, 932, 1020 in the other side of the differential circuit is connected to Vref (and vice versa). For a given set of circuit parameters, the differential structure improves the dynamic range of the signal and the supply noise rejection at the cost of a higher power. The circuit embodiments depicted in FIGS. 9 and 10 can be referred to as split-CDAC and merged-CDAC topologies and offer different benefits and tradeoffs. For example, the split-CDAC topology typically offers a simpler control operation as it does not require the switch pairs 1008, which can reduce area and power. However, the merged-CDAC typically offers several benefits: a) its area can be smaller as it requires a single set of capacitors to operate and capacitors tend to dominate the circuit area in advanced technology nodes; b) there is no reduction in signal swing, unlike in the split-CDAC operation where the charge sharing between node 1 and note 2 reduces the signal amplitude, hence degrading the signal to noise ratio and increasing the bit error rate (BER); and c) as the same capacitors are used for the input charge summation and the SAR operation, the impact of capacitor non-linearity is significantly reduced in the case of the merged-CDAC compared to the split-CDAC.

Figure 11:
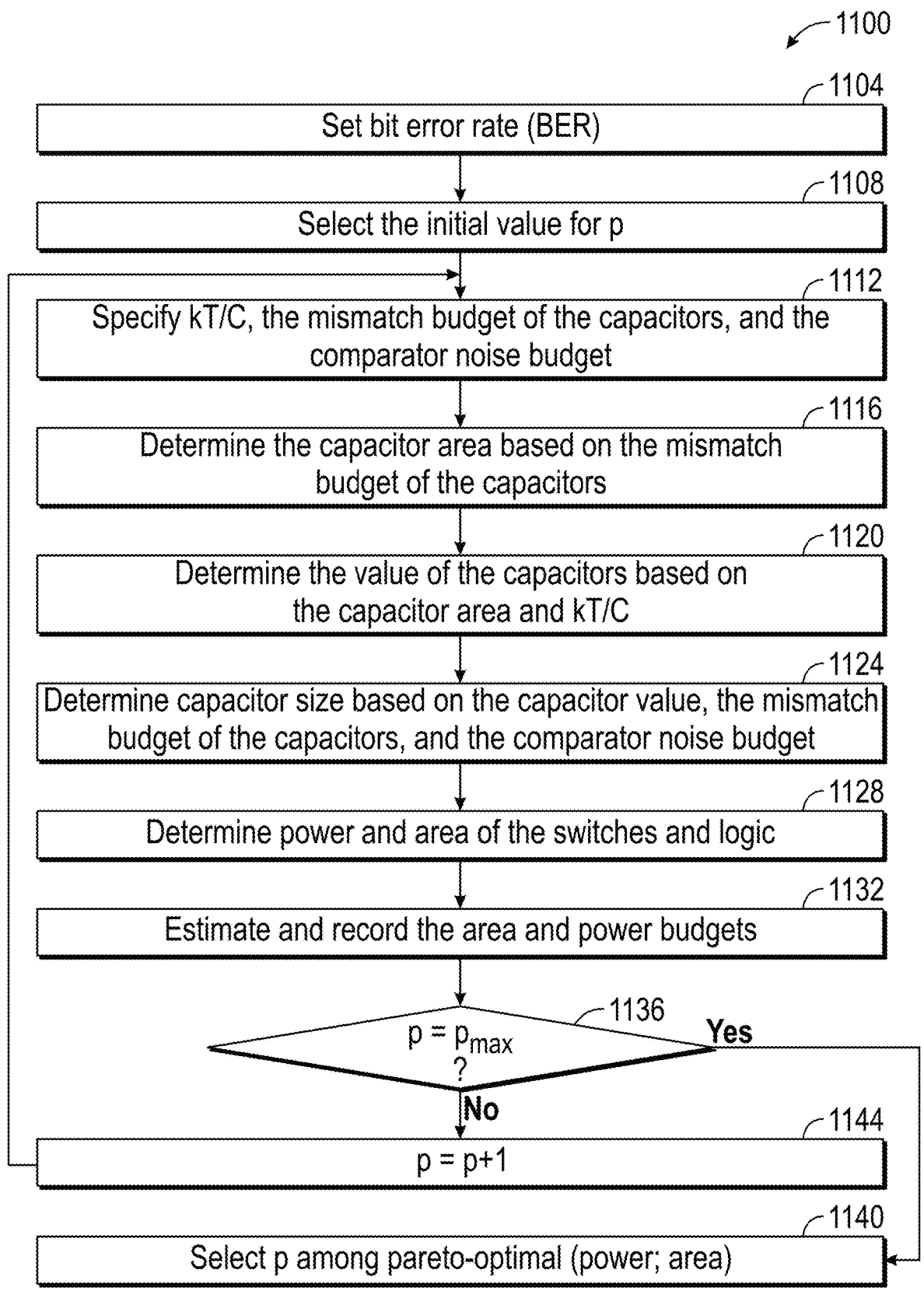
FIG. 11 is a flowchart for an example method for optimizing the size of the inner product of the equation of FIG. 2A, in accordance with an example embodiment.

FIG. 11 is a flowchart for an example method 1100 for optimizing the size of the inner product of the equation of FIG. 2A, in accordance with an example embodiment. In general, there is a tradeoff in finding the optimal size of the inner product: low p leads to power requirements being comparable to a digital implementation, while a high p requires a very fine resolution in the analog voltage levels, which is costly in terms of power. In one example embodiment, the bit error rate specification is set (operation 1104) and the initial value for p is selected; for example, p may be set to 1 (operation 1108). The three main sources of error (maximum noise values), the kT/C (noise of the capacitor), the mismatch of the capacitors, and the comparator noise budget, are specified (operation 1112). For example, each of the three components can be allocated one third of the total noise budget. The area of the capacitors is determined based on the mismatch sigma budget (operation 1116) using device simulations and/or Pelgrom's law model (sigma prop 1/A where A is the capacitor's area). The value of the capacitors is determined based on the capacitor noise budget kT/C and the operating temperature T (operation 1120). In some embodiments, the steps are performed in the order described, while steps 112, 116 and 120 can be done in any order; in other embodiments, the steps can be done in a different order than that described.

The comparator sizing is determined, for example, based on the comparator noise budget (operation 1124). For example, the size of all the devices of the comparator 944, 1024 can be increased to reduce its noise budget, or some finer optimization can be performed. The power and area of the switches and logic are determined, for example, based on datasheets or circuit-level simulations (operation 1128). The area and power budgets are estimated and recorded (operation 1132). A check is performed to determine if p equals $p_{max}$ (decision block 1136), where pmax can be set based on a designer's experience/heuristically or, for a given embodiment (such as the example embodiment of FIG. 6B), pmax can be set as pmax=log 2(M). If p does not equal $p_{max}$ (NO branch of decision block 1136), the value of p is incremented (operation 1144) and the method 1100 proceeds with operation 1112. If p equals $p_{max}$ (YES branch of decision block 1136), p is selected among the pareto-optimal points (in terms of power and device area) (operation 1140) and the method 1100 ends.

A number of use cases, such as low precision neural networks, may utilize a different precision for the two inputs, such as a precision of $n_1$ for X and $n_2$ for W. The disclosed techniques can be adjusted to accommodate this configuration without any fundamental change in the topology. In this case, the number of 1b digital multiplication circuits will change from $n^2$ to $n_1 \cdot n_2$. The unit circuit stays identical (e.g., an AND gate). This results in a number of outputs N of the digital multiplication circuit 404, where $N=M \cdot n_1 \cdot n_2$.

The individual analog compression unit 530 operates unchanged. However, the number of the analog compression units 530 of the first stage 504-1 will change, the maximum index changing from 530-A-$(n^2)$ to 530-A-$(n_1 \cdot n_2)$. Note that A is still defined by A=floor(M/($2^P$–1)) as per FIG. 7.

The second stage 504-2 is composed of the same circuits as in the case where the two inputs X and W have the same number of bits of precision n, except that the definition of N'v from equation 680-2 is adjusted. The sum over k is now from 0 to $n_1$–1 and the sum over j is now from 0 to $n_2$–1.

Given the discussion thus far, it will be appreciated that, in one aspect, a method comprises the operations of converting a dot product of two vectors x and w, where each element $x_i$ and $w_i$ has m bits, to $M=m^2$ one bit by one bit multiplications, where $x_{i,m}$ and $w_{i,m}$ (note that in usage of $x_{i,m}$ and $w_{i,m}$ (meaning individual bit values of m-bit numbers $x_i$, $w_i$), the same letter (m) is used for both an index enumerating individual bits in a multi-bit number and the total number of bits in that number, as will be appreciated by the skilled artisan from the comments) each have 1 bit; setting a variable A to floor(M/($2^P$–1)) where M is a count of inputs, p is an analog resolution, and A is a count of rows of inner product summation circuits 520 (operation 704); designing a first stage 504-1 based on <A, $n^2$> where n is an input precision of the multiply-accumulate device (operation 708); and counting inputs N'v and designing a second stage 504-2 with ceiling (N'v/($2^P$–1))>Bv>floor(N'v/($2^P$–1)) analog inputs and Kv=N'v–($2^P$–1)*Bv, the counting and designing of the second stage 504-2 being performed for each bit position v where v<2*n+p–1, Bv is a quotient of a division of N'v by $2^P$–1, and Kv is a remainder of the division operation (operation 712).

In one aspect, a multiply-accumulate device 400 comprises a digital multiplication circuit 404, the digital multiplication circuit 404 configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands; a mixed signal adder 408, the mixed signal adder 408 comprising: one or more stages 504-1, 504-2, at least one stage 504-1, 504-2 configured to input the N one-bit multiplication outputs, each stage 504-1, 504-2 comprising one or more inner product summation circuits 520; and a digital reduction stage 412 coupled to an output of a last stage of the one or more stages 504-1, 504-2 and configured to generate an output of the multiply-accumulate device 400 based on the L $m_1$-bit multipliers and the L $m_2$-bit multiplicands.

In one aspect, a non-transitory computer readable medium comprises computer executable instructions which when executed by a computer cause the computer to perform the method of converting a dot product of two vectors x and w, where each element $x_i$ and $w_i$ has m bits, to $M=m^2$ one bit by one bit multiplications, where $x_{i,m}$ and $w_{i,m}$ each have 1 bit; setting a variable A to floor(M/($2^P$–1)) where M is a count of inputs, p is an analog resolution, and A is a count of rows of inner product summation circuits 520 (operation 704); designing a first stage 504-1 based on <A, $n^2$> where n is an input precision of the multiply-accumulate device (operation 708); and counting inputs N'v and designing a second stage 504-2 with ceiling (N'v/($2^P$–1))>Bv>floor(N'v/($2^P$–1)) analog inputs and Kv=N'v–($2^P$–1)*Bv, the counting and designing of the second stage 504-2 being performed for each bit position v where v<2*n+p–1, Bv is a quotient of a division of N'v by $2^P$–1, and Kv is a remainder of the division operation (operation 712).

In one example embodiment, each inner product summation circuit 520 (FIGS. 3, 5, 6A, 6B) comprises a SAR controller 928; a set of equally-weighted input capacitors 920 coupled to the N one-bit multiplication outputs and configured to generate an input voltage based on a subset of the N one-bit multiplication outputs; a set of weighted output capacitors 932 coupled to the SAR controller 928 and configured to generate a voltage based on a digital value generated by the SAR controller 928; and a comparator 944 coupled to the set of equally-weighted input capacitors 920, coupled to the set of weighted output capacitors 932, and configured to compare the voltage generated by the set of weighted output capacitors 932 and the generated by the set of equally-weighted input capacitors 920.

In one example embodiment, each SAR controller 928 is configured to conduct a binary search of the digital value.

In one example embodiment, at least one of the one or more inner product summation circuits and the analog to digital conversion circuits are implemented using a differential topology. Furthermore in this regard, in one or more embodiments, the "inner product summation circuit" and "A/D conversion circuit" in this context can share components. One or more embodiments include a SAR controller, two CDACs (equally-weighted and weighted, the latter for example "binary weighted") and a comparator. Formally, it might be considered that only equally-weighted CDAC (a/k/a equally-weighted capacitor set) does not belong to the ADC per se; however, in certain cases the two CDACs are merged together into one shared set of capacitors (see FIG. 10), where the latter are distinguished only "functionally" via appropriate actions of a SAR controller which first invokes a single capacitor set of $2^N$–1 identical capacitors (when applying an array of inner products to be summed to the ADC), and then later (during iterative A/D conversion process) groups the very same capacitor set into N binary weighted groups with weights of $2^{N-1}$, $2^{N-2}$, . . . , 2, 1 (the sum of these weights is $2^N$–1).

In one example embodiment, at least one of said one or more stages comprises a digital compression tree configured to perform a multiplication operation on a proper subset of inputs to a corresponding stage. In one example embodiment, each inner product summation circuit 520 (FIG. 9) comprises a SAR controller 928 configured to generate a digital output for the corresponding inner product summation circuit 520; a common input node; a common output node; a plurality of equally-weighted input capacitors 920, each of the plurality of input capacitors 920 having two terminals, one terminal of each equally-weighted input capacitor 920 being coupled to the common input node; a plurality of input switches 916, each input switch 916 being controlled by an output of a corresponding logic gate 912 of a plurality of logic gates 912 of the digital multiplication circuit 404, each input switch 916 configured to charge a corresponding equally-weighted input capacitor 920 of the plurality of equally-weighted input capacitors 920 in response to the output of the corresponding logic gate 912 being a logic one and to refrain from charging the corresponding equally-weighted input capacitor 920 of the plurality of equally-weighted input capacitors 920 in response to the output of the corresponding logic gate 912 being a logic zero; a plurality of weighted output capacitors 932, one terminal of each weighted output capacitor 932 being coupled to the common output node; a plurality of output switches 936, each output switch 936 being controlled by a corresponding bit of the digital output of the SAR controller 928, each output switch 936 being configured to discharge a corresponding weighted output capacitor 932 of the plurality of weighted output capacitors 932 based on a corresponding bit of the digital output of the SAR controller 928 being a logic zero and to refrain from discharging the corresponding weighted output capacitor 932 of the plurality of weighted output capacitors 932 based on the corresponding bit of the digital output of the SAR controller 928 being a logic one; a transfer switch 940 configured to selectively couple and isolate the common input node and the common output node; an input precharge switch 948 configured to precharge the plurality of weighted output capacitors 932 based on a control signal; an output precharge switch 952 configured to precharge the plurality of equally-weighted input capacitors 920 based on a control signal; and a comparator 944 configured to compare a voltage on the common output node and a reference voltage.

In one example embodiment, each inner product summation circuit 520 (FIG. 10) comprises a controller 1028 configured to generate a digital output for the corresponding inner product summation circuit 520; a common input node; a plurality of capacitors 1020, each of the plurality of input capacitors 1020 having two terminals, one terminal of each capacitor 1020 being coupled to the common input node; a precharge switch 1004 configured to selectively connect and isolate a reference voltage $V_{CM}$ and the common node; a plurality of transmission gates 1016, each transmission gate 1016 configured to charge a corresponding capacitor 1020 of the plurality of capacitors 1020 based on one of an output of a corresponding logic gate 1012 of a plurality of logic gates 1012 of the digital multiplication circuit 404 and the digital output and to discharge the corresponding capacitor 1020 of the plurality of capacitors 1020 based on one of the output of the corresponding logic gate 1012 of the plurality of logic gates 1012 and the digital output; a plurality of switch pairs 1008, each switch pair 1008 being configured to couple a control input of a corresponding transmission gate 1016 of the plurality of transmission gates 1016 to one of the output of a corresponding logic gate 1012 of the plurality of logic gates 1012 and a corresponding bit of the digital output; and a comparator configured to compare a voltage on the common node and a reference voltage.

In one example embodiment, a voltage level of an analog sum (FIG. 9: Nodes 1, 2) is adjusted by one or more of: changing a voltage level during a reset phase and changing a code of a successive approximation register digital-to-analog converter (SAR DAC) 908 during an initialization of the successive approximation register digital-to-analog converter (SAR DAC) 908 to limit the voltage level to a minimum voltage level, a maximum voltage level, or both during a digital-to-analog conversion operation. In one example embodiment, a signal voltage level is offset by a fraction of a least-significant-bit relative to a reference voltage of a comparator 944 to maintain the comparator 944 in a non-metastable position; the offset is created by applying a voltage offset to the reference voltage of the comparator 944 of a fraction of a least-significant-bit; or the offset is created by adding to the input CDAC a capacitor of value of a fraction of a unit capacitor and switching its bottom plate during summation.

Furthermore in this regard, consider the output voltage signal of a single-ended CDAC during a stage of preparation of input signal for a subsequent A/D conversion process. Specifically, such preparation is typically implemented as a 2-step process: i) bottom plates of all unit capacitors of CDAC receive an input vector (0—connect to $V_{SS}$, 1—connect to $V_{REF}$), while all top plates are connected together and anchored to a voltage source $V_{CM}$ (refer to FIG. 10 here), and ii) the common top plates of all capacitors go floating (i.e. VCM source is disconnected), while the bottom plates receive a "mid-range" vector of 1 in MSB and 0 in all other bits (again 1 means connection to $V_{REF}$ and 0 means connection to $V_{SS}$). Observe that stage 1 places a vector of charges on the capacitors (equal to the input vector) but does not change the comparator input (since it is anchored to $V_{CM}$), while stage 2 causes that vector to manifest as the comparator input voltage representing the sum of the input vector components (computing that sum is the function of the complete "inner product summation circuit," but that sum manifest first as an analog signal and then the ADC converts it from the analog to digital domain). The described circuit has an issue under some circumstances as the stage 2 process introduces an unintended 1/2 LSB offset to the resultant analog voltage at the comparator input. One can describe the origin of that offset as follows: assume that the circuit has N-bit resolution (e.g. N=5) and thus involves $2^N-1$ unit capacitors in its CDAC; then one can easily compute the total dynamic range after step 2 and check if it is properly centered vs $V_{CM}$ (as it should) by observing two extreme cases when in stage 1 all bottom plates go high (to $V_{REF}$) or low (to $V_{SS}$) respectively. Then in step 2 one brings the bottom plates of all MSB unit capacitors (there are $2^N-1$ of them) to $V_{REF}$ and all the remaining capacitors of all other bits (there are $2^{N-1}-1$ of them, i.e. one less than in MSB section) to $V_{SS}$. As a consequence, in a first case (all bottom plates high) the bottom plates of MSB capacitors would remain high, while all other ones would have their bottom plates traveling down from $V_{REF}$ to $V_{SS}$ and thus remove $2^{N-1}-1$ unit charges (of $V_{REF}*C_0$, where $C_0$ is unit capacitance) from the floating CDAC output (causing it to go below $V_{CM}$ accordingly). In contrast in the second case of all bottom plates low, in stage 2 obtain all MSB unit caps having their bottom plates traveling up from VSS to $V_{REF}$, while bottom plates of capacitors in all other bits will remain low, yielding adding $2^{N-1}$ unit charges—in contrast to removing only $2^{N-1}-1$ unit charges in the prior case, one unit charge of difference. As a consequence, the midpoint between the two boundaries of the ADC input dynamic range, i.e. between $-(2^{N-1}-1)$ and $+2^{N-1}$ is occurring not at zero (as desired) but at +1/2 unit charges, i.e. at 1/2 LSB. This effect one can call a systematic 1/2 LSB offset of signal at the comparator input and if left unaddressed, it would significantly negatively impact the operation of the circuit, since nominally the ADC is simply measuring a value of a signal that nominally takes INTEGER values (in LSB units), albeit slightly corrupted by noise, so ADC simply rounds such value to the nearest integer. If one offsets the input of such ADC by 1/2 LSB the corresponding rounding operation immediately becomes ambiguous, since rounding becomes 50/50 probabilistic. Several mitigation strategies are available to remove that systematic 1/2 LSB offset from step 2 process.

One possible practical technique to remove the unintended 1/2 LSB offset after stage 2 in preparation the analog input signal for subsequent A/B conversion is to modify the comparator threshold offset, a function that is needed anyway due to comparator offset is never "nominal zero" due to finite comparator parts mismatch. The skilled artisan will be familiar with the function of comparator offset compensation such as via a simple DAC of moderate resolution. Another practical technique is to apply 1/2 LSB shift to the input signal of the ADC (i.e. to output signal of CDAC) by explicitly adding a half-size capacitor section to the CDAC array, so that the added half-unit-sized section would have its bottom plate receiving a "1" data value (causing it to connect to $V_{REF}$) in stage 1, and then reset to VSS in stage 2. The latter reset event (in stage 2) then will always remove 1/2 of unit charge from a floating comparator input and thus will center the dynamic range from original asymmetric $\{-(2^{N-1}-1), +2^{N-1}\}$ range to adjusted symmetric (offset-free) range of $\{-(2^{N-1}-1/2), +2^{N-1}-1/2\}$, i.e. 1/2 unit charges less than the original asymmetric one, and thereby completely mitigate the problem. The advantage of the latter approach is that the nominal offset of the comparator then becomes simply zero, a much easier target to calibrate for vs "1/2 LSB" voltage value, particularly due to LSB voltage value not being exactly defined, in contrast to LSB charge value (the former depends on unknown parasitic capacitance terms). The disadvantage is that obtaining a capacitor of exactly 1/2 unit size may be inconvenient; it would highly depend on how the unit capacitor is designed, so ultimately that method may end up impractical, if half-size capacitor is difficult to obtain without a respective redesign of a unit capacitor and potentially increasing its size that may negatively impact the energy and/or area efficiency of the proposed circuit.

As discussed elsewhere herein, a third practical technique includes to apply an offset of 1/2 LSB by forming 1/2 unit charge without a need to use an inconvenient half-sized capacitor nor poorly defined 1/2 LSB intentional comparator voltage offset. Instead it employs two regular unit capacitors, with only one of them charged to one unit charge, while another staying discharged, then connecting them so the charge redistributes between them equally (due to symmetry), leaving 1/2 unit charge on each, and then resetting only one of the two, thereby causing it to remove 1/2 unit charge from the comparator unit.

Also, generally, the skilled artisan will appreciate that one or more embodiments include a device 500 including of an hybrid of digital logic and analog charge summation to perform INT accumulate or multiply-accumulate operations without loss of precision; a device 1000 implementing the charge summation of multiple inputs in parallel using a single ADC circuit shared across steps of the conversion; and/or a method 1100 to size the resolution (i.e. number of bits) of the analog pop counter based on computations of the circuit's power and area for a corresponding precision constraint.

Furthermore, the skilled artisan will appreciate that in general, the methods disclosed herein can be performed on devises/systems/apparatuses as disclosed herein, and the like.

In one example embodiment, the capacitor of value of the fraction of the unit capacitor is implemented as a combination of two capacitors of unit value where, during a first operation, a first capacitor of the two capacitors is charged to a voltage level, while a second capacitor of the two capacitors is connected to a 0 voltage level and, during a second operation, the two capacitors are connected in parallel and, during a third operation, the first capacitor is connected to the summing node. In one example embodiment, a design of an integrated circuit is instantiated as a design structure based on the designed first stage 504-1 and the designed second stage 504-2; and a physical integrated circuit is fabricated in accordance with the design structure. In one example embodiment, a bit error rate (BER) specification is set (operation 1104); a value for the analog resolution p is selected (operation 1108); a kT/C parameter, a mismatch budget of a plurality of capacitors, and a comparator noise budget are specified (operation 1112); an area of each of the plurality of capacitors is determined based on the mismatch budget (operation 1116); a value of the capacitors is determined based on the capacitor area and kT/C (operation 1120); a comparator sizing is determined based on the capacitor value, the mismatch budget of the capacitors, and the comparator noise budget (operation 1124); a power and an area of a plurality of switches and logic of the multiply-accumulate device 900, 1000 are determined (operation 1128); and an area and a power budget of the multiply-accumulate device 900, 1000 are estimated and recorded (operation 1132). In one example embodiment, the selecting, specifying, determining, estimating and recording operations are repeated for another value of the analog resolution p. In one example embodiment, a value of the analog resolution p is incremented in response to the value of the analog resolution p being unequal to an analog resolution $p_{max}$; and a pareto-optimal value of the analog resolution p is selected (operation 1140) in response to the value of the analog resolution p being equal to the analog resolution $p_{max}$. In one example embodiment, a design of an integrated circuit is instantiated as a design structure based on the designed first stage 504-1, the designed second stage 504-2, and the pareto-optimal value of the analog resolution p; and a physical integrated circuit is fabricated in accordance with the design structure. In one or more embodiments, a further step includes fabricating a physical integrated circuit. One non-limiting specific example of accomplishing this is described elsewhere herein in connection with FIGS. 13-15. For example, a design structure is provided to fabrication equipment to facilitate fabrication of a physical integrated circuit in accordance with the design structure.

In one or more embodiments, a layout is prepared. In one or more embodiments, the layout is instantiated as a design structure. In one or more embodiments, a physical integrated circuit is fabricated in accordance with the design structure.

As noted, in one or more embodiments, the layout is instantiated as a design structure. See discussion of FIG. 15. A physical integrated circuit is then fabricated in accordance with the design structure. See again discussion of FIG. 15. Refer also to FIG. 14. Once the physical design data is obtained, based, in part, on the design processes described herein, an integrated circuit designed in accordance therewith can be fabricated according to known processes that are generally described with reference to FIG. 13. Generally, a wafer with multiple copies of the final design is fabricated and cut (i.e., diced) such that each die is one copy of the integrated circuit. At block 1310, the processes include fabricating masks for lithography based on the finalized physical layout. At block 1320, fabricating the wafer includes using the masks to perform photolithography and etching. Once the wafer is diced, testing and sorting each die is performed at 1330 to filter out any faulty die.

Figure 13:
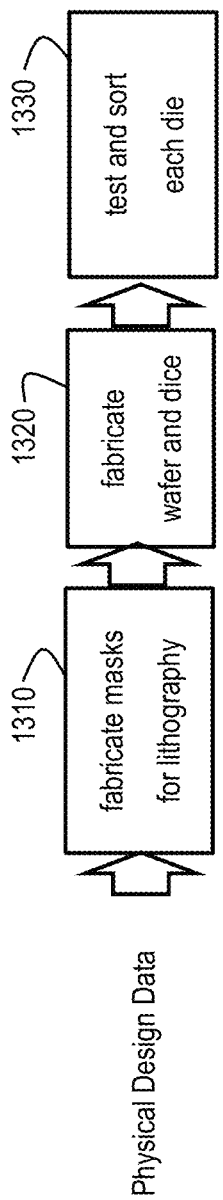
FIG. 13 is a flow diagram of a design process used in semiconductor design, manufacture, and/or test.
Figure 14:
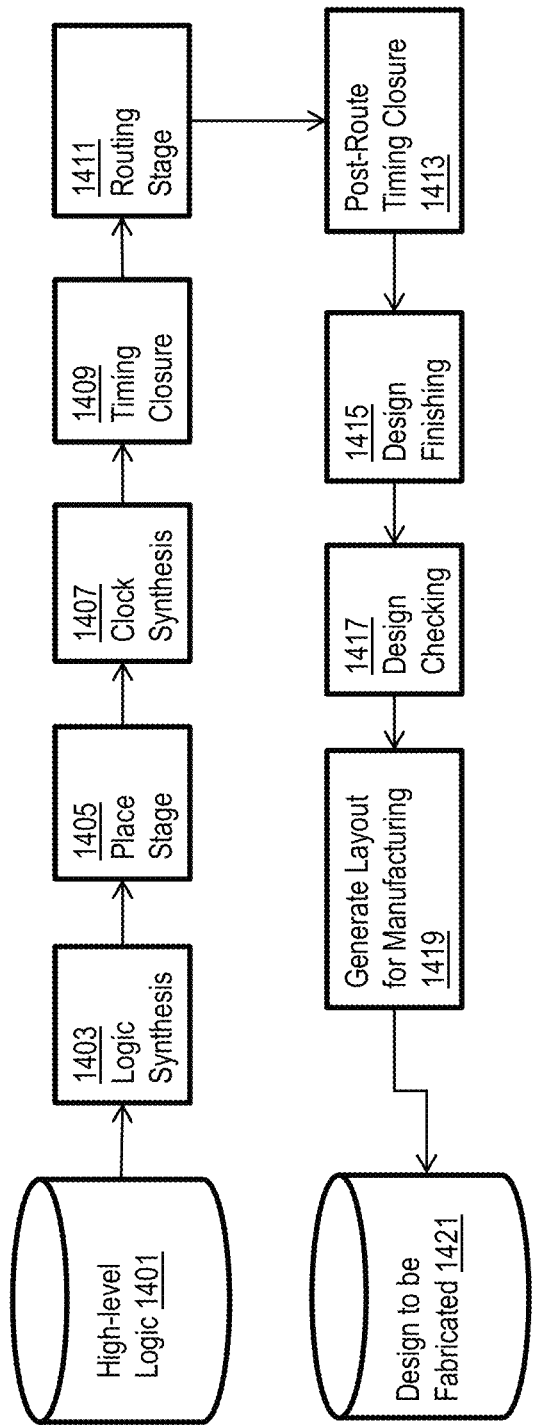
FIG. 14 shows further aspects of IC fabrication from physical design data.
Figure 15:
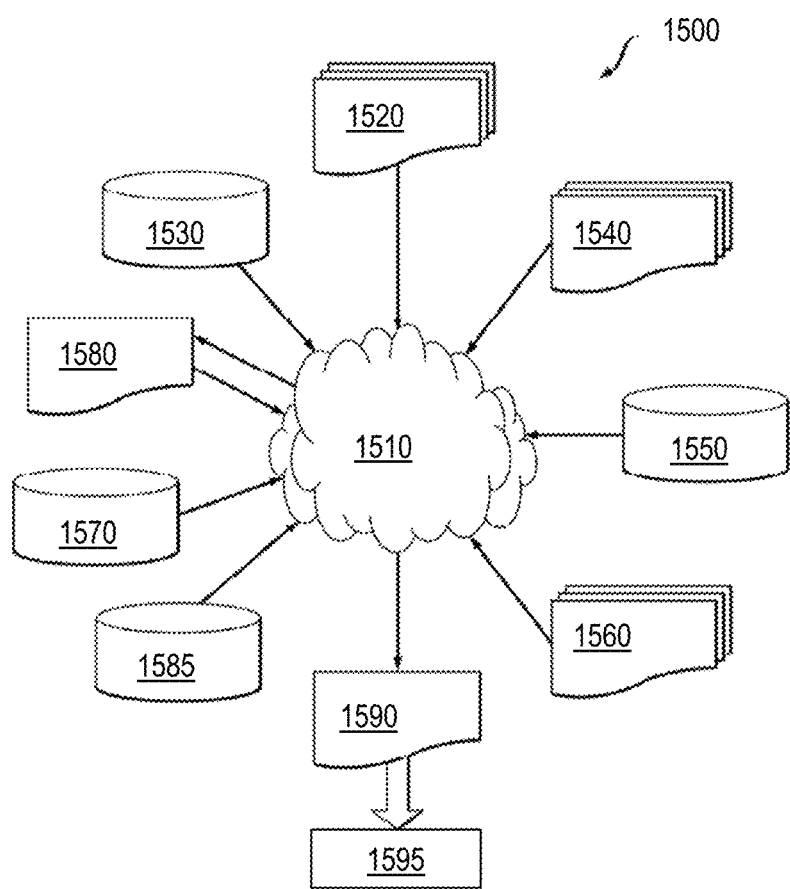
FIG. 15 shows an exemplary high-level Electronic Design Automation (EDA) tool flow, within which aspects of the invention can be employed.

Furthermore, referring to FIGS. 13-15, in one or more embodiments the at least one processor is operative to generate a design structure for the integrated circuit design in accordance with the VLSI design, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure.

FIG. 14 depicts an example high-level Electronic Design Automation (EDA) tool flow, which is responsible for creating an optimized microprocessor (or other IC) design to be manufactured. A designer could start with a high-level logic description 1401 of the circuit (e.g. VHDL or Verilog). The logic synthesis tool 1403 compiles the logic, and optimizes it without any sense of its physical representation, and with estimated timing information. The placement tool 1405 takes the logical description and places each component, looking to minimize congestion in each area of the design. The clock synthesis tool 1407 optimizes the clock tree network by cloning/balancing/buffering the latches or registers. The timing closure step 1409 performs a number of optimizations on the design, including buffering, wire tuning, and circuit repowering; its goal is to produce a design which is routable, without timing violations, and without excess power consumption. The routing stage 1411 takes the placed/optimized design, and determines how to create wires to connect all of the components, without causing manufacturing violations. Post-route timing closure 1413 performs another set of optimizations to resolve any violations that are remaining after the routing. Design finishing 1415 then adds extra metal shapes to the netlist, to conform with manufacturing requirements. The checking steps 1417 analyze whether the design is violating any requirements such as manufacturing, timing, power, electromigration or noise. When the design is clean, the final step 1419 is to generate a layout for the design, representing all the shapes to be fabricated in the design to be fabricated 1421.

Figure 12:
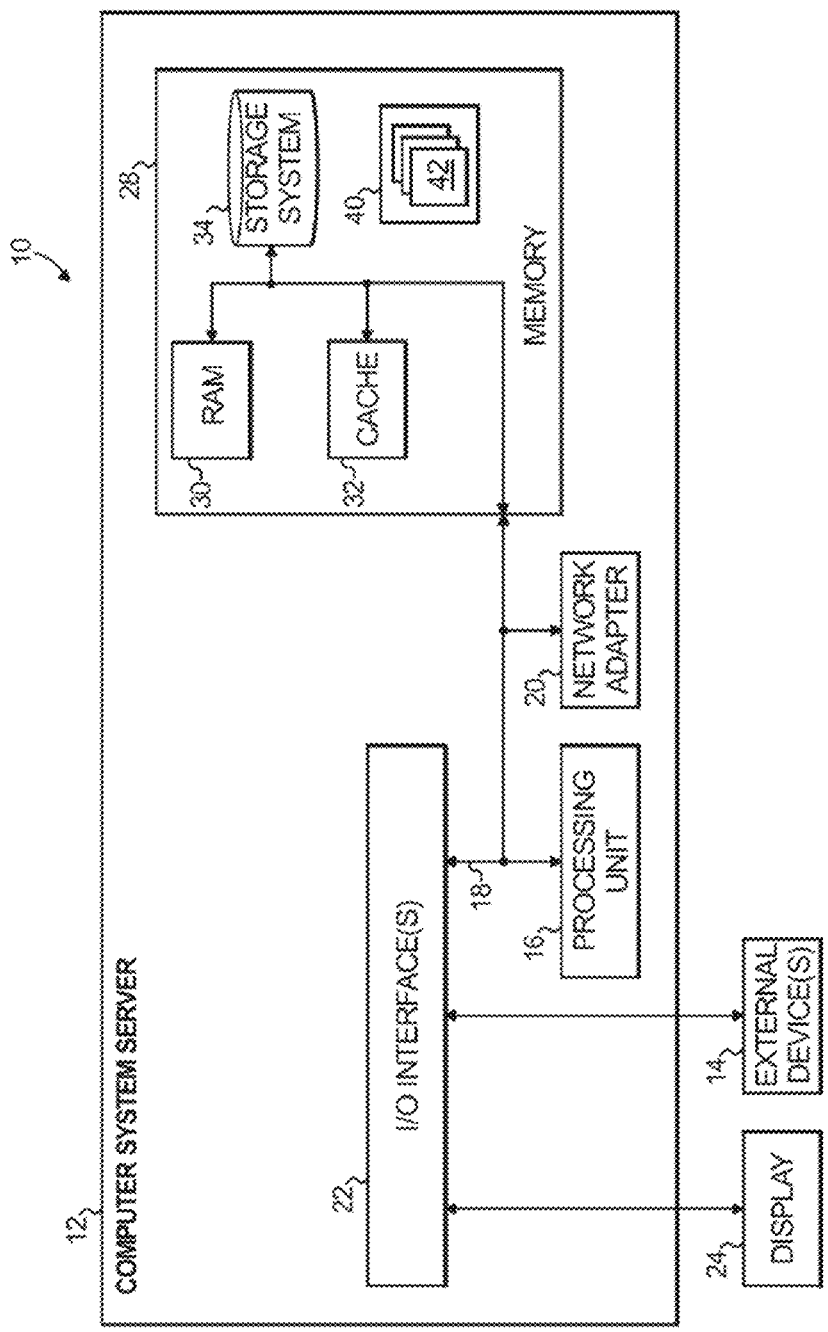
FIG. 12 depicts a computer system that may be useful in implementing one or more aspects and/or elements of the invention.

One or more embodiments of the invention, or elements thereof, can be implemented in the form of an apparatus including a memory and at least one processor that is coupled to the memory and operative to perform exemplary method steps. FIG. 12 depicts a computer system that may be useful in implementing one or more aspects and/or elements of the invention. The system is depicted as a cloud computing node 10 but is also representative of computer useful in non-cloud and/or hybrid implementations.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 12, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 12, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 12) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the timing analysis techniques herein with semiconductor integrated circuit design simulation, test, layout, and/or manufacture. In this regard, FIG. 15 shows a block diagram of an exemplary design flow 1500 used for example, in semiconductor IC logic design, simulation, test, layout, and manufacture. Design flow 1500 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 1500 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1500 may vary depending on the type of representation being designed. For example, a design flow 1500 for building an application specific IC (ASIC) may differ from a design flow 1500 for designing a standard component or from a design flow 1500 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1520 that is preferably processed by a design process 1510. Design structure 1520 may be a logical simulation design structure generated and processed by design process 1510 to produce a logically equivalent functional representation of a hardware device. Design structure 1520 may also or alternatively comprise data and/or program instructions that when processed by design process 1510, generate a functional representation of the physical structure of a hardware device. Whether representing functional and/or structural design features, design structure 1520 may be generated using electronic computer-aided design (ECAD) such as implemented by a core developer/designer. When encoded on a gate array or storage medium or the like, design structure 1520 may be accessed and processed by one or more hardware and/or software modules within design process 1510 to simulate or otherwise functionally represent an electronic component, circuit, electronic or logic module, apparatus, device, or system. As such, design structure 1520 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1510 preferably employs and incorporates hardware and/or software modules for synthesizing, translating, or otherwise processing a design/simulation functional equivalent of components, circuits, devices, or logic structures to generate a Netlist 1580 which may contain design structures such as design structure 1520. Netlist 1580 may comprise, for example, compiled or otherwise processed data structures representing a list of wires, discrete components, logic gates, control circuits, I/O devices, models, etc. that describes the connections to other elements and circuits in an integrated circuit design. Netlist 1580 may be synthesized using an iterative process in which netlist 1580 is resynthesized one or more times depending on design specifications and parameters for the device. As with other design structure types described herein, netlist 1580 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 1510 may include hardware and software modules for processing a variety of input data structure types including Netlist 1580. Such data structure types may reside, for example, within library elements 1530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1540, characterization data 1550, verification data 1560, design rules 1570, and test data files 1585 which may include input test patterns, output test results, and other testing information. Design process 1510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1510 without deviating from the scope and spirit of the invention. Design process 1510 may also include modules for performing standard circuit design processes such as timing analysis, verification, design rule checking, place and route operations, etc. Improved placement can be performed as described herein.

Design process 1510 employs and incorporates logic and physical design tools such as HDL compilers and simulation model build tools to process design structure 1520 together with some or all of the depicted supporting data structures along with any additional mechanical design or data (if applicable), to generate a second design structure 1590. Design structure 1590 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1520, design structure 1590 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 1290 may comprise a compiled, executable HDL simulation model that functionally simulates the devices to be analyzed.

Design structure 1590 may also employ a data format used for the exchange of layout data of integrated circuits and/or symbolic data format (e.g. information stored in a GDSII (GDS2), GL1, OASIS, map files, or any other suitable format for storing such design data structures). Design structure 1590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 1590 may then proceed to a stage 1595 where, for example, design structure 1590: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A multiply-accumulate device, the device comprising:
a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands;

a mixed signal adder, the mixed signal adder comprising:
one or more stages, at least one stage configured to input the N one-bit multiplication outputs, each stage comprising one or more inner product summation circuits; and
a digital reduction stage coupled to an output of a last stage of the one or more stages and configured to generate an output of the multiply-accumulate device based on the L $m_1$-bit multipliers and the L $m_2$-bit multiplicands,
wherein each inner product summation circuit comprises:
a controller configured to generate a digital output for the corresponding inner product summation circuit;
a common input node;
a plurality of capacitors, each of the plurality of capacitors having two terminals, one terminal of each capacitor being coupled to the common input node;
a precharge switch configured to selectively connect and isolate a reference voltage and the common input node;
a plurality of transmission gates, each transmission gate configured to charge a corresponding capacitor of the plurality of capacitors based on one of an output of a corresponding logic gate of a plurality of logic gates of the digital multiplication circuit and the digital output and to discharge the corresponding capacitor of the plurality of capacitors based on one of the output of the corresponding logic gate of the plurality of logic gates and the digital output;
a plurality of switch pairs, each switch pair being configured to couple a control input of a corresponding transmission gate of the plurality of transmission gates to one of the output of a corresponding logic gate of the plurality of logic gates and a corresponding bit of the digital output; and
a comparator configured to compare a voltage on the common input node and the reference voltage.

2. The multiply-accumulate device of claim 1, wherein at least one of said one or more stages comprises a digital compression tree configured to perform a multiplication operation on a proper subset of inputs to a corresponding stage.

3. A multiply-accumulate device, the device comprising:
a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands;
a mixed signal adder, the mixed signal adder comprising:
one or more stages, at least one stage configured to input the N one-bit multiplication outputs, each stage comprising one or more inner product summation circuits; and
a digital reduction stage coupled to an output of a last stage of the one or more stages and configured to generate an output of the multiply-accumulate device based on the L $m_1$-bit multipliers and the L $m_2$-bit multiplicands,
wherein each inner product summation circuit comprises:
a successive approximation register (SAR) controller;
a set of equally-weighted input capacitors coupled to the N one-bit multiplication outputs and configured to generate an input voltage based on a subset of the N one-bit multiplication outputs;
a set of weighted output capacitors coupled to the SAR controller and configured to generate a voltage based on a digital value generated by the SAR controller; and
a comparator coupled to the set of equally-weighted input capacitors, coupled to the set of weighted output capacitors, and configured to compare the voltage generated by the set of weighted output capacitors and the generated by the set of equally-weighted input capacitors.

4. The multiply-accumulate device of claim 3, wherein each SAR controller is configured to conduct a binary search of the digital value.

5. The multiply-accumulate device of claim 3, wherein at least one of the one or more inner product summation circuits are implemented using a differential topology.

6. A multiply-accumulate device, the device comprising:
a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands;
a mixed signal adder, the mixed signal adder comprising:
one or more stages, at least one stage configured to input the N one-bit multiplication outputs, each stage comprising one or more inner product summation circuits; and
a digital reduction stage coupled to an output of a last stage of the one or more stages and configured to generate an output of the multiply-accumulate device based on the L $m_1$-bit multipliers and the L $m_2$-bit multiplicands,
wherein each inner product summation circuit comprises:
a successive approximation register (SAR) controller configured to generate a digital output for the corresponding inner product summation circuit;
a common input node;
a common output node;
a plurality of equally-weighted input capacitors, each of the plurality of equally-weighted input capacitors having two terminals, one terminal of each equally-weighted input capacitor being coupled to the common input node;
a plurality of input switches, each input switch being controlled by an output of a corresponding logic gate of a plurality of logic gates of the digital multiplication circuit, each input switch configured to charge a corresponding equally-weighted input capacitor of the plurality of equally-weighted input capacitors in response to the output of the corresponding logic gate being a logic one and to refrain from charging the corresponding equally-weighted input capacitor of the plurality of equally-weighted input capacitors in response to the output of the corresponding logic gate being a logic zero;
a plurality of weighted output capacitors, one terminal of each weighted output capacitor being coupled to the common output node;
a plurality of output switches, each output switch being controlled by a corresponding bit of the digital output of the SAR controller, each output switch being configured to discharge a corresponding weighted output capacitor of the plurality of weighted output capacitors based on a corresponding bit of the digital output of the SAR controller being a logic zero and to refrain from discharging the corresponding weighted output capacitor of the plurality of weighted output capacitors based on the corresponding bit of the digital output of the SAR controller being a logic one;

a transfer switch configured to selectively couple and isolate the common input node and the common output node;

an input precharge switch configured to precharge the plurality of weighted output capacitors based on a control signal;

an output precharge switch configured to precharge the plurality of equally-weighted input capacitors based on a control signal; and a comparator configured to compare a voltage on the common output node and a reference voltage.

7. A multiply-accumulate device, the device comprising:
a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands;

a mixed signal adder, the mixed signal adder comprising:
one or more stages, at least one stage configured to input the N one-bit multiplication outputs, each stage comprising one or more inner product summation circuits; and a digital reduction stage coupled to an output of a last stage of the one or more stages and configured to generate an output of the multiply-accumulate device based on the L $m_1$-bit multipliers and the L $m_2$-bit multiplicands, wherein a voltage level of an analog sum is adjusted by one or more of: changing a voltage level during a reset phase and changing a code of a successive approximation register digital-to-analog converter (SAR DAC) during an initialization of the successive approximation register digital-to-analog converter (SAR DAC) to limit the voltage level to a minimum voltage level, a maximum voltage level, or both during a digital-to-analog conversion operation.

8. A multiply-accumulate device, the device comprising:
a digital multiplication circuit, the digital multiplication circuit configured to input L $m_1$-bit multipliers and L $m_2$-bit multiplicands and configured to generate N one-bit multiplication outputs, each one-bit multiplication output corresponding to a result of a multiplication of one bit of one of the L $m_1$-bit multipliers and one bit of one of the L $m_2$-bit multiplicands;

a mixed signal adder, the mixed signal adder comprising:
one or more stages, at least one stage configured to input the N one-bit multiplication outputs, each stage comprising one or more inner product summation circuits; and a digital reduction stage coupled to an output of a last stage of the one or more stages and configured to generate an output of the multiply-accumulate device based on the L $m_1$-bit multipliers and the L $m_2$-bit multiplicands, wherein:
a signal voltage level is offset by a fraction of a least-significant-bit relative to a reference voltage of a comparator to maintain the comparator in a non-metastable position;

wherein the offset is created by applying a voltage offset to the reference voltage of the comparator of a fraction of a least-significant-bit; or wherein the offset is created by adding to an input CDAC a capacitor of value of a fraction of a unit capacitor and switching its bottom plate during summation.

9. The multiply-accumulate device of claim 8, wherein the capacitor of value of the fraction of the unit capacitor is implemented as a combination of two capacitors of unit value where, during a first operation, a first capacitor of the two capacitors is charged to a voltage level, while a second capacitor of the two capacitors is connected to a 0 voltage level and, during a second operation, the two capacitors are connected in parallel and, during a third operation, the first capacitor is connected to a summing node.

* * * * *